(12) United States Patent
Akebono et al.

(10) Patent No.: US 11,653,119 B2
(45) Date of Patent: May 16, 2023

(54) SOLID-STATE IMAGE SENSOR AND IMAGING DEVICE

(71) Applicant: Sony Semiconductor Solutions Corporation, Kanagawa (JP)

(72) Inventors: Sachio Akebono, Kanagawa (JP); Yosuke Ueno, Kanagawa (JP)

(73) Assignee: Sony Semiconductor Solution Corporation, Kanagawa (JP)

( * ) Notice: Subject to any disclaimer, the term of this patent is extended or adjusted under 35 U.S.C. 154(b) by 72 days.

(21) Appl. No.: 17/436,820

(22) PCT Filed: Nov. 26, 2019

(86) PCT No.: PCT/JP2019/046089
§ 371 (c)(1),
(2) Date: Sep. 7, 2021

(87) PCT Pub. No.: WO2020/183808
PCT Pub. Date: Sep. 17, 2020

(65) Prior Publication Data
US 2022/0174231 A1    Jun. 2, 2022

(30) Foreign Application Priority Data

Mar. 14, 2019 (JP) .............................. JP2019-046578

(51) Int. Cl.
*H04N 5/369* (2011.01)
*H04N 5/3745* (2011.01)

(52) U.S. Cl.
CPC ....... *H04N 5/3698* (2013.01); *H04N 5/37455* (2013.01); *H04N 5/37457* (2013.01)

(58) Field of Classification Search
None
See application file for complete search history.

(56) References Cited

U.S. PATENT DOCUMENTS

| 2011/0249162 A1 | 10/2011 | Moore |
| 2017/0054931 A1 | 2/2017 | Wang et al. |
| 2017/0150869 A1* | 6/2017 | Adachi .................. A61B 1/051 |

FOREIGN PATENT DOCUMENTS

| JP | 2018-148541 A | 9/2018 |
| WO | 2019/026564 A1 | 2/2019 |

OTHER PUBLICATIONS

International Search Report (PCT/ISA/210), International Application No. PCT/JP2019/046089, dated Jan. 10, 2020.

* cited by examiner

*Primary Examiner* — Mark T Monk
(74) *Attorney, Agent, or Firm* — Michael Best & Friedrich LLP

(57) ABSTRACT

In a solid-state image sensor provided with a comparator that compares a reference signal and a pixel signal, the image quality of image data is improved.

A voltage divider circuit supplies a divided voltage of an input voltage and a predetermined reference voltage that are input. An input-side differential transistor outputs a drain current corresponding to the gate-source voltage between the divided voltage input to the gate and a predetermined source voltage. An output-side differential transistor outputs a voltage corresponding to the drain current as a result of comparison between the input voltage and the reference voltage. A control transistor reduces the gate-source voltage in a case where the input voltage is out of a predetermined range.

8 Claims, 17 Drawing Sheets

FIG. 10

SOLID-STATE IMAGE SENSOR AND IMAGING DEVICE

TECHNICAL FIELD

The present technology relates to a solid-state image sensor and an imaging device. More specifically, the present technology relates to a solid-state image sensor provided with a single-slope ADC and an imaging device.

BACKGROUND ART

Conventionally, due to the simple configuration, a single-slope analog to digital converter (ADC) that converts an analog signal into a digital signal by a comparator and a counter has been used in a solid-state image sensor or the like. For example, an ADC has been proposed in which a differential amplifier circuit including a pair of differential transistors and a voltage divider circuit for supplying a divided voltage of a reference signal and a pixel signal to one of the pair of differential transistors are arranged in a comparator (see Patent Document 1, for example).

CITATION LIST

Patent Document

Patent Document 1: Japanese Patent Application Laid-Open No. 2018-148541

SUMMARY OF THE INVENTION

Problems to be Solved by the Invention

In the above-mentioned conventional technology, by adding the voltage divider circuit, the power supply voltage required for operation is reduced to reduce power consumption. However, if The difference between the reset level and signal level of the pixel signal is very large, the gate-source voltage of the differential transistor increases, and the parasitic capacitance of the differential transistor may increase due to the increase. There is a problem that this increase in parasitic capacitance causes an error in the inversion timing of the comparison result between the reference signal and the pixel signal, and the error leads to deterioration of the image quality of The image data.

The present technology has been created in view of such a situation, and aims to improve the image quality of image data in a solid-state image sensor provided with a comparator that compares a reference signal and a pixel signal.

Solutions to Problems

The present technology has been made to solve the above-mentioned problem, and a first aspect thereof is a solid-state image sensor including: a voltage divider circuit that supplies a divided voltage of an input voltage and a predetermined reference voltage that are input; an input-side differential transistor that outputs a drain current corresponding to a gate-source voltage between the divided voltage input to the gate and a predetermined source voltage; an output-side differential transistor that outputs a voltage corresponding to the drain current as a result of comparison between the input voltage and the reference voltage; and a control transistor that reduces the gate-source voltage in a case where the input voltage is out of a predetermined range. This has the effect of reducing the gate-source voltage of a differential transistor.

Additionally, in the first aspect, the solid-state image sensor may further include: a tail current source commonly connected to the source of the input-side differential transistor and the source of the output-side differential transistor; an input-side current mirror transistor having the drain and gate connected to the drain of the input-side differential transistor; and an output-side current mirror transistor having the drain connected to the drain of the output-side differential transistor, and the Gate connected to the gate of the input-side current mirror transistor. The control transistor may have the gate connected to the output node of the voltage divider circuit, and the source connected to a connection point of the input-side differential transistor and the input-side current mirror transistor. This has the effect of reducing the gate-source voltage of a differential transistor in a comparator in which a diode-connected transistor is arranged.

Additionally, in the first aspect, the solid-state image sensor may further include: a tail current source commonly connected to the source of the input-side differential transistor and the source of the output-side differential transistor; an input-side resistor having one end connected to the drain of the input-side differential transistor; and an output-side resistor having one end connected to the drain of the output-side differential transistor. The control transistor may have the gate connected to the output node of the voltage divider circuit, and the source connected to a connection point of the input-side differential transistor and the input-side resistor. This has the effect of reducing the gate-source voltage of a differential transistor in a comparator with only N-type or P-type transistors.

Additionally, in the first aspect, the solid-state image sensor may further include: an input-side current mirror transistor having the gate connected to a connection point of the input-side differential transistor and the input-side resistor, and the drain connected to another end of the input-side resistor; and an output-side current mirror transistor having the drain connected to another end of the output-side resistor, and the gate connected to the gate of the input-side current mirror transistor. This has the effect of reducing power consumption.

Additionally, in the first aspect, the input-side differential transistor, the output-side differential transistor, and the control transistor may be P-type transistors, and the control transistor may reduce a drain voltage of the input-side differential transistor in a case where the input voltage as lower than a predetermined value. This has the effect of reducing the gate-source voltage of a differential transistor when a signal level lower than the reset level is input.

Additionally, in the first aspect, the input-side differential transistor, the output-side differential transistor, and the control transistor may be N-type transistors, and the control transistor may increase a drain voltage of the input-side differential transistor in a case where the input voltage is higher than a predetermined value. This has the effect of reducing the pate-source voltage of a differential transistor when a signal level higher than the reset level is input.

Additionally, in the first aspect, the voltage divider circuit may change the voltage division ratio between the input voltage and the reference voltage according to a control signal. This has the effect of reducing the gate source voltage of a differential transistor in a comparator with a variable voltage division ratio.

Additionally, a second aspect of the present technology is an imaging device including: a voltage divider circuit that supplies a divided voltage of an input voltage and a predetermined reference voltage that are input; an input-side differential transistor that outputs a drain current corresponding to a gate-source voltage between the divided voltage input to the gate and a predetermined source voltage; an output-side differential transistor that outputs a voltage corresponding to the drain current as a result of comparison between the input voltage and the reference voltage; a control transistor that reduces the gate-source voltage in a case where the input voltage is out of a predetermined range; and a counter that counts a count value on the basis of the comparison result. This has the effect of reducing the gate-source voltage of a differential transistor and improving the image quality of image data.

BRIEF DESCRIPTION OF DRAWINGS

FIG. 10 is a graph showing an example of the relationship between the amplitude and the node voltage in the first embodiment of the present technology and the comparative example.

MODE FOR CARRYING OUT THE INVENTION

Hereinafter, modes for carrying out the present technology (hereinafter referred to as embodiments) will be described. The description will be given in the following order.

Figure 1:
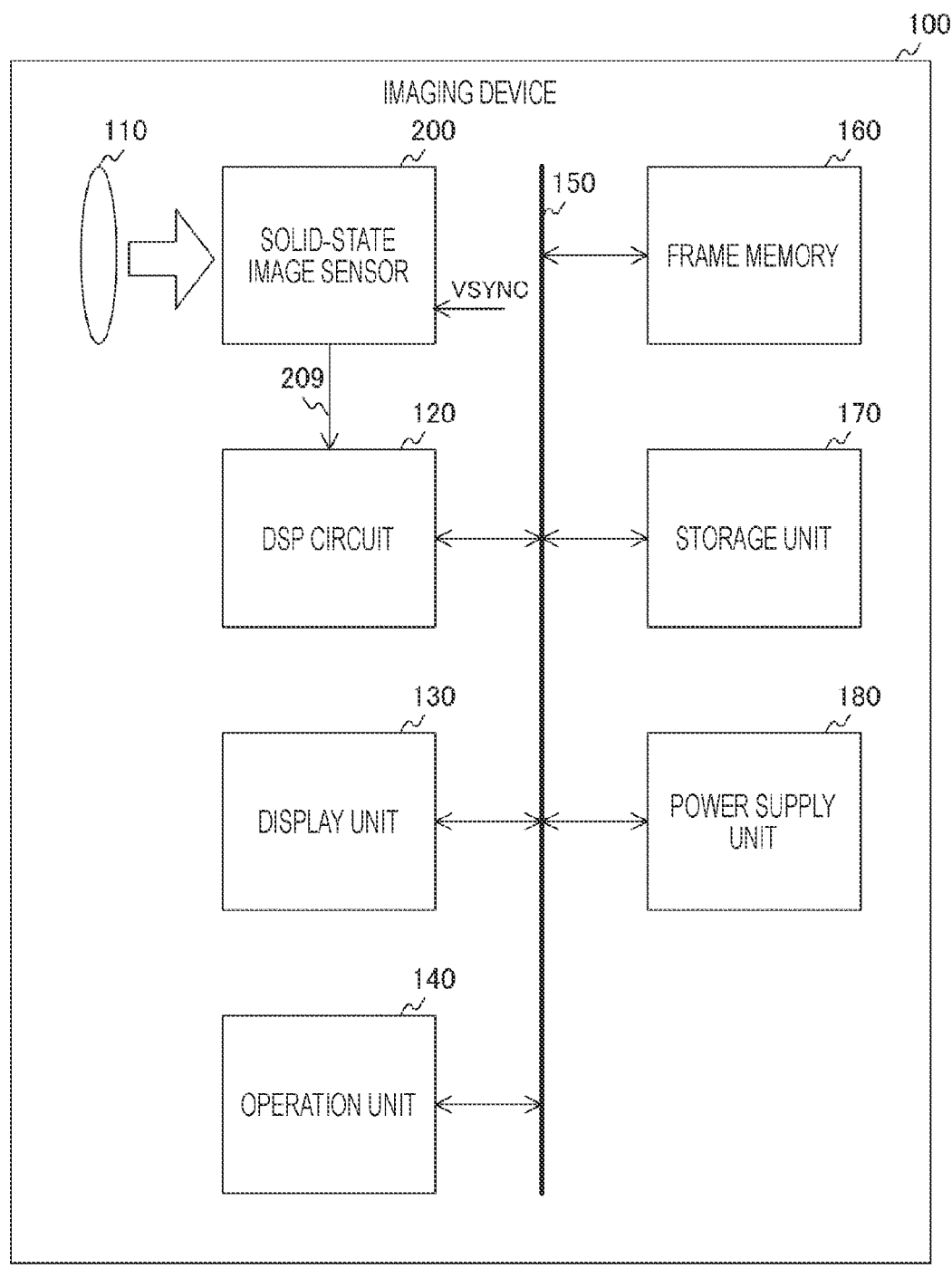
FIG. 1 is a block diagram showing a configuration example of an imaging device of a first embodiment of the present technology.

1. First embodiment (example of reducing gate-source voltage of differential transistor)
2. Second embodiment. (example of reducing gate-source voltage of a differential transistor to which resistor is connected)
3. Third embodiment (example of reducing gate-source voltage of differential transistor and inserting resistor between differential transistor and current mirror circuit)
4. Fourth embodiment (example of reducing gate-source voltage of N-type differential transistor)
5. Example of application to endoscopic surgery system
6. Example of application to movable body 1. First Embodiment Configuration Example of Imaging Device FIG. 1 is a block diagram showing a configuration example of an imaging device 100 of a first embodiment of the present technology. The imaging device 100 is a device for capturing image data, and includes an optical unit 110, a solid-state image sensor 200, and a digital signal processing (DSP) circuit 120. Moreover, the imaging device 100 includes a display unit 130, an operation unit 140, a bus 150, a frame memory 160, a storage unit 170, and a power supply unit 180. As the imaging device 100, a digital camera such as a digital still camera, a smartphone or a personal computer having an imaging function, an in-vehicle camera, or the like may be used, for example.

The optical unit 110 collects light from a subject and guides it to the solid-state image sensor 200. The solid-state image sensor 200 generates image data by photoelectric conversion in synchronization with a vertical synchronization signal VSYNC. Here, the vertical synchronization signal VSYNC is a periodic signal having a predetermined frequency indicating the timing of imaging. The solid-state image sensor 200 supplies the generated image data to the DSP circuit 120 through a signal line 209.

The DSP circuit 120 performs predetermined image processing on the image data from the solid-state image sensor 200. The DSP circuit 120 outputs the processed image data to the frame memory 160 or the like through the bus 150.

The display unit 130 displays image data. As the display unit 130, a liquid crystal panel or an organic electro luminescence (Et) panel may be used, for example. The operation unit 140 generates an operation signal according to a user operation.

The bus 150 is a common path for the optical unit 110, the solid-state image sensor 200, the DSP circuit 120, the display unit 130, the operation unit 140, the frame memory 160, the storage unit 170, and the power supply unit 180 to exchange data with each other.

The frame memory 160 holds image data. The storage unit 170 stores various data such as image data. The power supply unit 180 supplies power to the solid-state image sensor 200, the DSP circuit 120, the display unit 130, and the like.

Configuration Example of Solid-State Image Sensor

Figure 2:
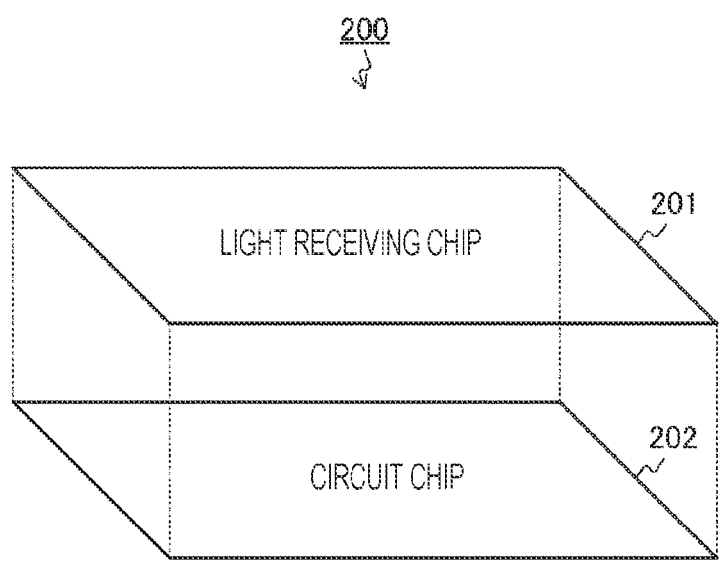
FIG. 2 is a diagram showing an example of a laminated structure of a solid-state image sensor of the first embodiment of the present technology.

FIG. 2 is a diagram showing an example of a laminated structure of the solid-state image sensor 200 of the first embodiment of the present technology. The solid-state image sensor 200 includes a circuit chip 202 and a light receiving chip 201 laminated on the circuit chip 202. These chips are electrically connected through a connection part such as a via. Note that other than a via, Cu—Cu bonding or a bump can be used for connection.

Figure 3:
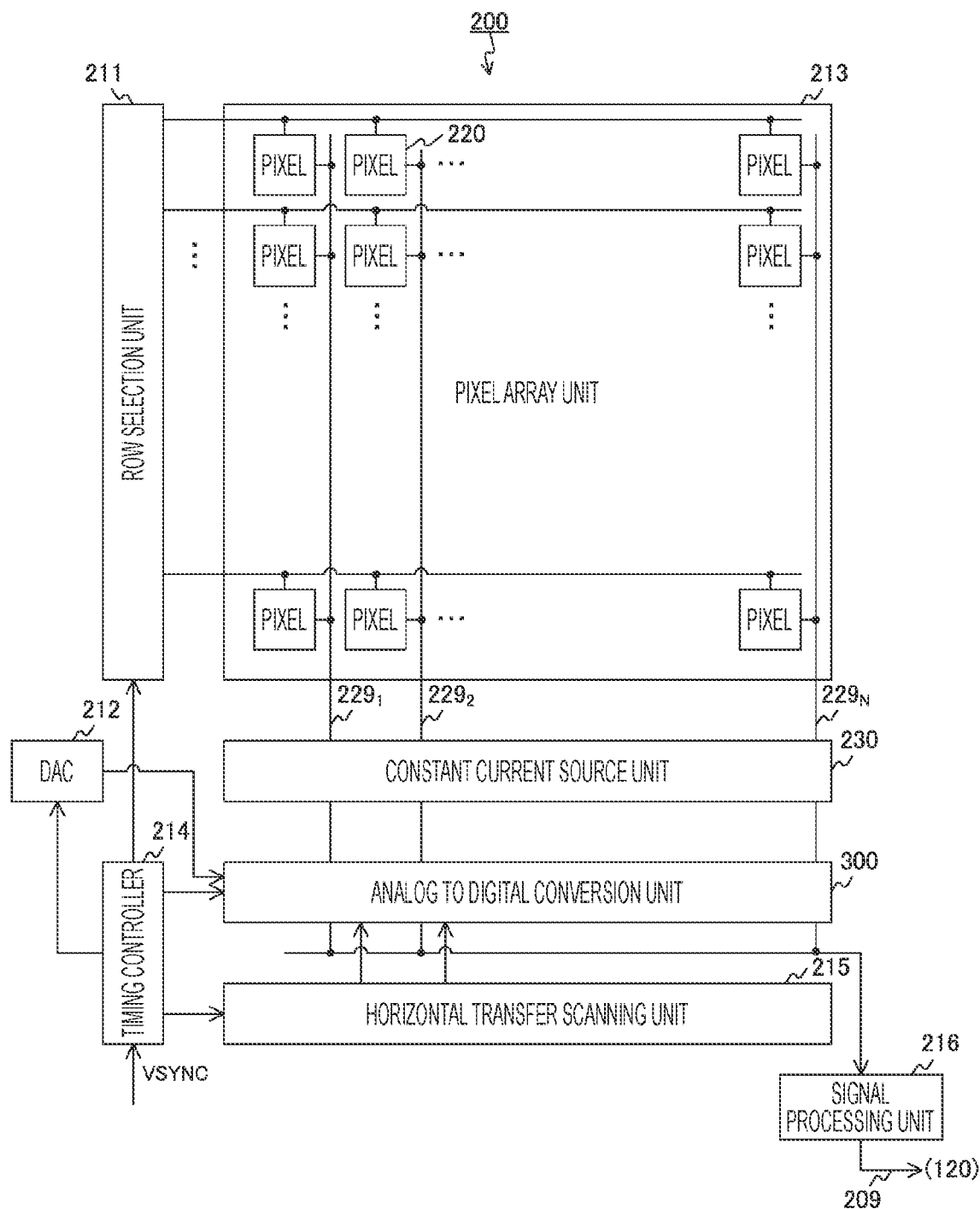
FIG. 3 is a block diagram showing a configuration example of the solid-state image sensor of the first embodiment of the present technology.

FIG. 3 is a block diagram showing a configuration example of the solid-state image sensor 200 of the first embodiment of the present technology. The solid-state image sensor 200 includes a row selection unit 211, a digital to analog converter (DAC) 212, and a pixel array unit 213. Adddtionally, the solid-state image sensor 200 further includes a timing controller 214, a constant current source unit 230, an analog to digital conversion unit 300, a horizontal transfer scanning unit 215, and a signal processing unit 216.

For example, the pixel array unit 213 is arranged on the light receiving chip 201, and other circuits (e.g., row selection unit 211) are arranged on the circuit chip 202. Note that the circuits arranged on each of the light receiving chip 201 and the circuit chip 202 are not limited to this configuration. For example, up to the comparator in the analog to digital conversion unit 300 may be arranged on the light receiving chip 201, and the subsequent stage may be arranged on the circuit chip 202.

In the pixel array unit 213, multiple pixels 220 are arranged in a two-dimensional lattice shape. Hereinafter, a set of pixels 220 arranged in the horizontal direction is referred to as a "row", and a set of pixels 220 arranged in a direction perpendicular to the row is referred to as a "column". Assume that the number of columns is N (N is an integer). Additionally, in the pixel array unit 213, a vertical signal line $229_n$ (n is an integer of 1 to N) is wired for each column.

The pixel 220 generates an analog pixel signal by photoelectric conversion and supplies it to the analog to digital conversion unit 300 through the corresponding vertical signal line $229_n$.

The row select on unit 211 sequentially selects and drives the rows, and outputs pixel signals. The DAC 212 generates a predetermined reference signal and supplies it to the analog to digital conversion unit 300. As a reference signal, a saw blade-shaped lamp signal is generated, for example.

The timing controller 214 controls the operation timing of each of the row selection unit 211, the analog to digital conversion unit 300, and the horizontal transfer scanning unit 215 in synchronization with the vertical synchronization signal VEYNC.

A constant current source is arranged for each column in the constant current source unit 230. Each constant current source is connected to the vertical signal line of the corresponding column.

For each column, the analog to digital conversion unit 300 converts the pixel signal of the column into a digital signal. The analog to digital conversion unit 300 outputs the digital signal for each column to the signal processing unit 216.

The horizontal transfer scanning unit 215 controls the analog to digital conversion unit 300 to sequentially output the pixel signals in the row.

The signal processing unit 216 performs predetermined signal processing such as dark current correction and demosaic processing on the digital signal. The signal processing unit 216 supplies image data including the processed signal to the DSP circuit 120 through the signal line 209.

Configuration Example of Pixel

Figure 4:
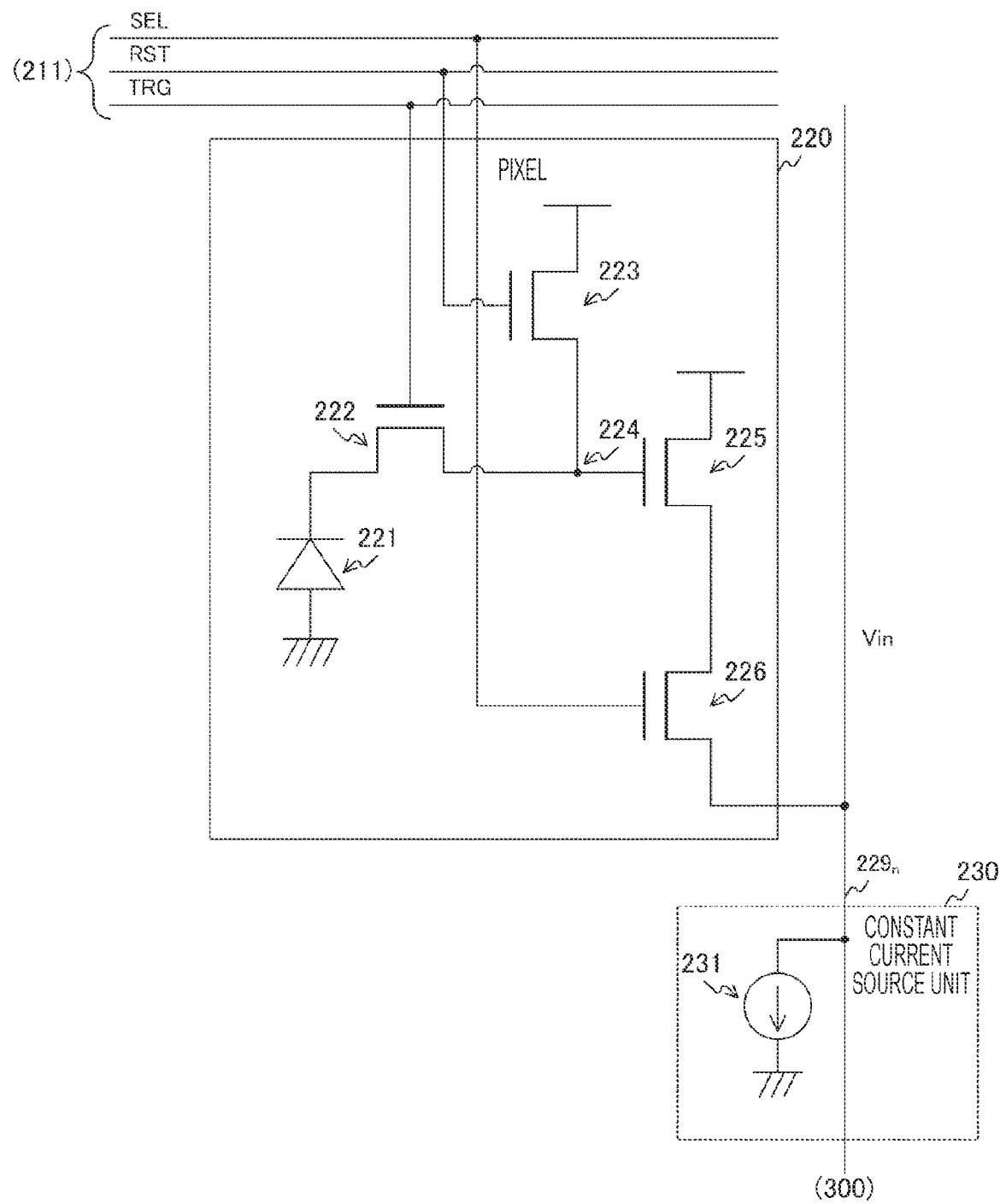
FIG. 4 is a circuit diagram showing a configuration example of a pixel of the first embodiment of the present technology.

FIG. 4 is a circuit diagram showing a configuration example of the pixel 220 of the first embodiment of the present technology. The pixel 220 includes a photoelectric conversion element. 221, a transfer transistor 222, a reset transistor 223, a floating diffusion layer 224, an amplification transistor 225, and a selection transistor 226.

Additionally, the constant current source unit. 230 is provided with a constant current source 231 for each column. The constant current source 231 supplies a constant current to the corresponding vertical signal line $229_n$.

The photoelectric conversion element 221 photoelectrically converts incident light to generate electric charge. The transfer transistor 222 transfers electric charge from the photoelectric conversion element 221 to the floating diffusion layer 224 according to a drive signal TRG from the row selection unit 211.

The reset transistor 223 is initialized by extracting electric charge from the floating diffusion layer 224 according to a drive signal RST from the row selection unit 211.

The floating diffusion layer 224 accumulates electric charge and generates a voltage corresponding to the amount of the electric charge. The amplification transistor 225 amplifies the voltage of the floating diffusion layer 224.

The selection transistor 226 outputs a signal of an amplified voltage as a pixel signal according to a drive signal SFL from the row selection unit 211. The pixel signal is supplied to the analog to digital conversion unit 300 through the corresponding vertical signal line $229_n$.

Configuration Example of Analog to Digital Conversion Unit

Figure 5:
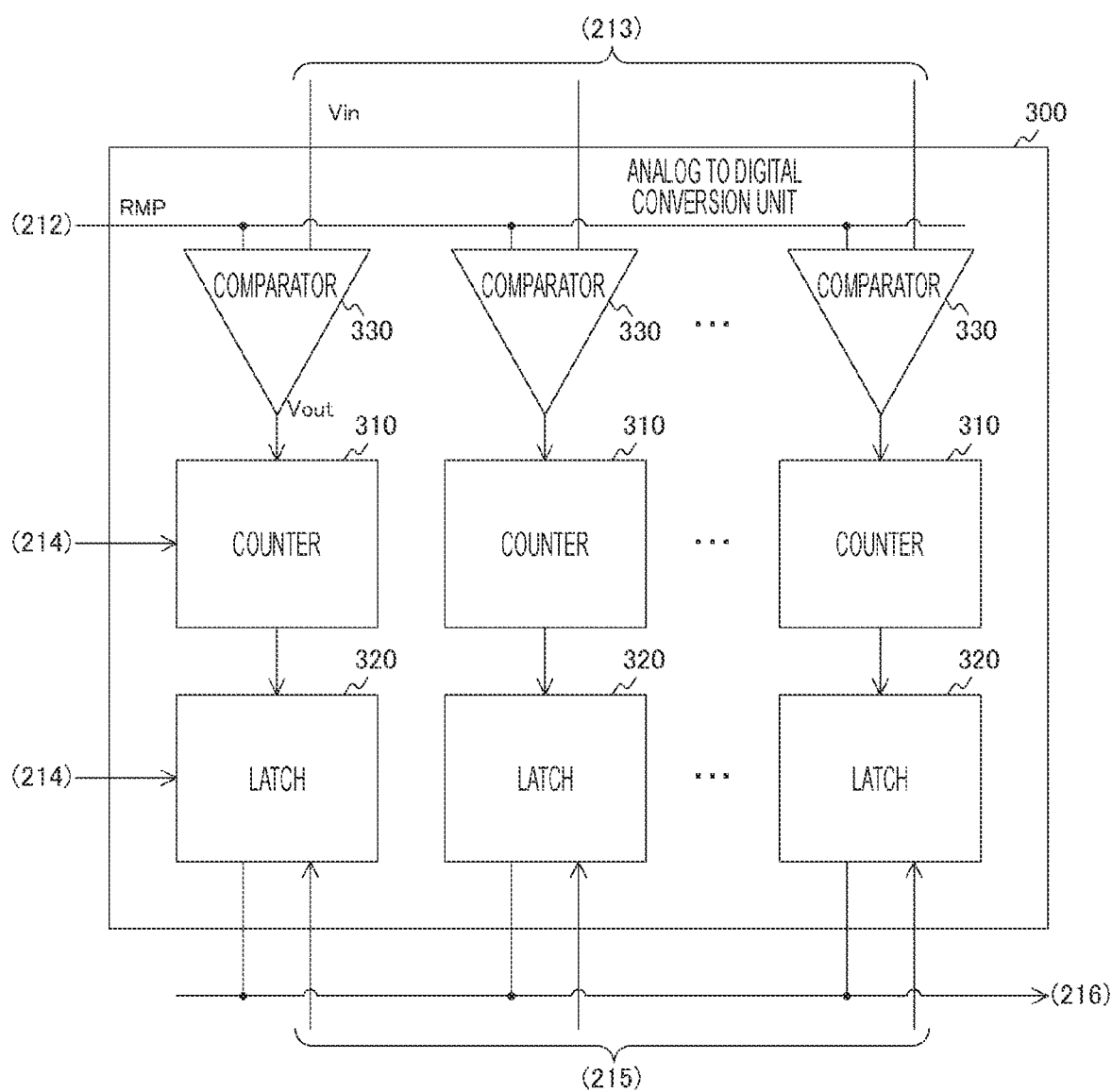
FIG. 5 is a block diagram showing a configuration example of an analog to digital conversion unit of the first embodiment of the present technology.

FIG. 5 is a circuit diagram showing a configuration example of the analog to digital conversion unit 300 of the first embodiment of the present technology. Multiple comparators 330, multiple counters 310, and multiple latches 320 are arranged in the analog to digital conversion unit 300. These comparators 330, counters 310, and latches 320 are provided for each column.

The comparator 330 compares a reference signal RMP with a pixel signal Vin from the corresponding column. The comparator 330 supplies a comparison result Vout to the corresponding counter 310.

The counter 310 counts the count value over a period until the comparison result Vout is inverted according to the control of the timing controller 214. The counter 310 outputs a digital signal indicating the count value to the corresponding latch 320 and causes the latch 320 to hold the digital signal.

The latch 320 holds the digital signal of the corresponding column. The latch 320 outputs the digital signal to the signal processing unit 216 under the control of the horizontal transfer scanning unit 215.

The comparator 330 and the counter 310 described above convert the analog pixel signal into a digital signal. That is, the comparator 330 and the counter 310 function as an ADC. An PDC having such a simple configuration including a comparator and a counter is called a single-slope ADC.

Additionally, other than AD conversion, the analog to digital conversion unit 300 performs correlated double sampling (CDS) processing for obtaining the difference between the reset level and the signal level for each column. Here, the reset level is a level of the pixel signal at the time of initialization of the pixel 220, and the signal level is a level of the pixel signal at the end of exposure. For example, CDS processing is achieved by the counter 310 performing one of counting down and counting up when converting the reset level, and the counter 310 performing the other of counting down and counting up when converting the signal level. Note that the counter 310 may be configured to perform only counting up or counting down, and a circuit for performing CDS processing may be added in the subsequent stage.

Configuration Example of Comparator

Figure 6:
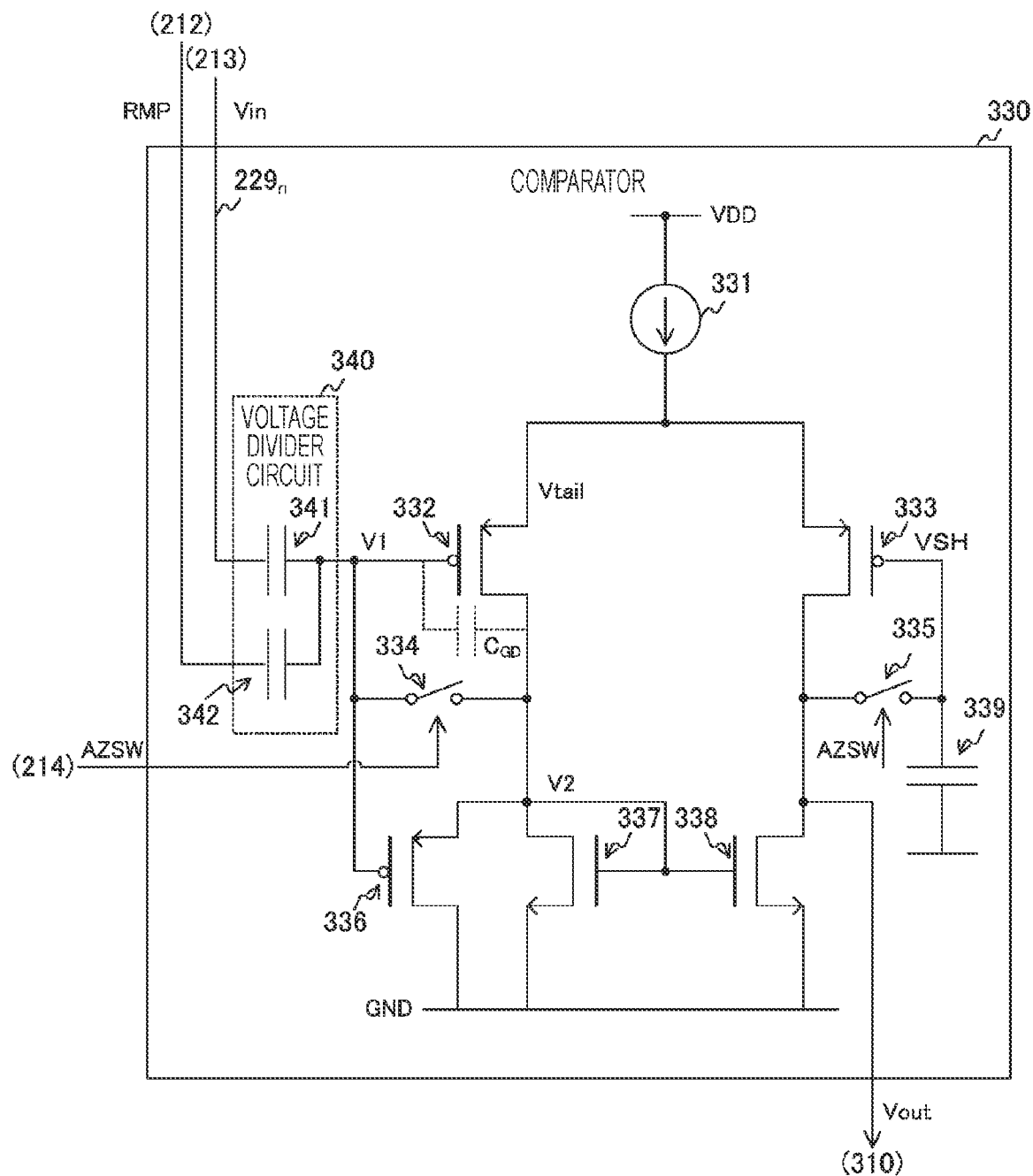
FIG. 6 is a circuit diagram showing a configuration example of a comparator of the first embodiment of the present technology.

FIG. 6 is a circuit diagram showing a configuration example of a comparator 330 of the first embodiment of the present technology. The comparator 330 includes a tail current source 331, differential transistors 332 and 333, auto-zero switches 334 and 335, and a control transistor 336. Additionally, the comparator 330 further includes current mirror transistors 337 and 338, a capacitor 339, and a voltage divider circuit 340. As the differential transistor 332, the differential transistor 333, and the control transistor 336, pMOS (p-type MOS) transistors are used, for example. Additionally, as the current mirror transistors 337 and 338, nMOS (n-type MOS) transistors are used, for example.

The voltage divider circuit 340 divides and supplies a divided voltage of the reference signal RMP and the pixel signal Vin. The voltage divider circuit 340 includes capacitors 341 and 342.

The capacitor 341 is inserted between the vertical signal line $229_n$ that transmits the pixel Vin and the gate of the differential transistor 332, and serves as an input capacitance for the pixel signal Vin. On the other hand, the capacitor 342 is inserted between the DAC 212 that supplies the reference signal RMP and the gate of the differential transistor 332, and serves as an input capacitance for the reference signal RMP.

The voltage of the pixel signal Vin and the reference voltage of the reference signal RMP are divided by a voltage division ratio determined on the basis of the capacitance of each of the capacitors 341 and 342. A divided voltage of the pixel signal Vin and the reference signal RMP is supplied cc the gates of the differential transistor 332 and the control transistor 336 as the gate voltage V1.

The sources of the differential transistors 332 and 333 are connected to terminals of a power supply voltage VDD through the tail current source 331. Additionally, the drain of the differential transistor 332 is connected to the source of the control transistor 336 and the drain of the current mirror transistor 337. On the other hand, the drain of the differential transistor 333 is connected to the drain of the current mirror transistor 338. Additionally, the voltage of the drain of the differential transistor 333 is output to the counter 310 as the comparison result Vout of the comparator 330.

Note that the differential transistor 332 is an example of an input-side differential transistor described in the claims. The differential transistor 333 is an example of an output-side differential transistor described in the claims.

The gate and drain of the current mirror transistor 337 are short-circuited. Additionally, the source of the current mirror transistor 337 is connected to a terminal having a predetermined reference potential (ground potential or the like). On the other hand, the gate of the current mirror transistor 338 is connected to the gate of the current mirror transistor 337, and the source of the current mirror transistor 338 is connected to the terminal of the reference potential. Additionally, the drain of the control transistor 336 is connected to the terminal of the reference potential.

Note that the current mirror transistor 337 is an example of an input-side current mirror transistor described in the claims. The current mirror transistor 338 is an example of an output-side current mirror transistor described in the claims.

The auto-zero switch 334 short-circuits between the gate and drain of the differential transistor 332 according to a control signal AZSW from the timing controller 214. The auto-zero switch 335 short-circuits between the gate and drain of the differential transistor 333 according to the control signal AZSW from the timing controller 214. The capacitor 339 is inserted between the gate of the differential transistor 333 and the terminal of the reference potential, and a constant voltage VSH is applied to the gate of the differential transistor 333.

For example, the timing controller 214 performs control to close the auto-zero switch 334 and perform an auto-zero operation at the timing immediately before the reset level conversion period and immediately before the signal level conversion period.

With the above configuration, the current mirror transistors 337 and 338 form a current mirror circuit. Additionally, a circuit including the current mirror circuit, the tail current source 331, and the differential transistors 332 and 333 forms a differential amplifier circuit.

In the differential amplifier circuit, the differential transistor 332 supplies a drain current corresponding to the gate-source voltage between the gate voltage 21 and a source voltage Vtail. Additionally, from the drain of the differential transistor 333, a voltage corresponding to the drain current is output as the comparison result out of the reference signal RMP and the pixel signal Vin.

Additionally, assume that the on-resistance of the control transistor 336 is smaller than the on-resistance of the diode-connected current mirror transistor 337. For this reason, when the control transistor 336 shifts to the ON state, a drain voltage V2 of the differential transistor 332 decreases. As the drain voltage V2 decreases, the source voltage Vtail of the differential transistor 332 also decreases. This decrease in the source voltage Vtail reduces the gate-source voltage of the differential transistor 332.

Here, in order to describe the effect of providing the control transistor 336, a configuration without the control transistor 336 is assumed as a comparative example.

Figure 7:
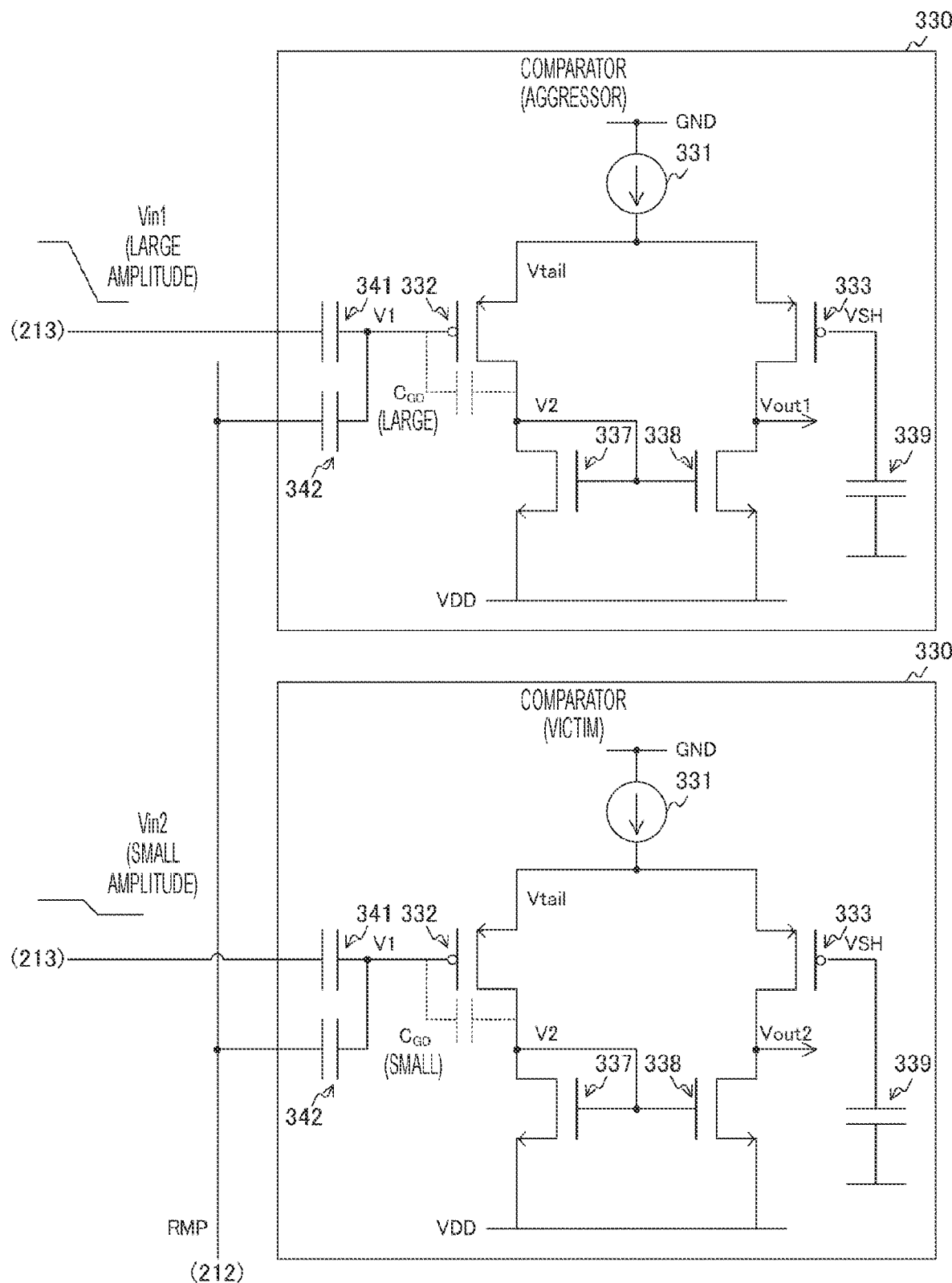
FIG. 7 is a diagram for describing a factor causing streaking in a comparative example.

FIG. 7 is a diagram for describing a factor causing streaking in the comparative example. In a case where the pixel 220 accumulates electrons as electric charge, the higher the illuminance of the incident light, the lower the signal level of the pixel signal Vin relative to the reset level of the pixel signal Vin. In other words, the higher the illuminance, the greater the amplitude when changing from the reset level to the signal level.

Assume that the amplitude of a pixel signal Vin in one column is very large and the amplitude of a pixel signal Vin2 in another column is relatively small. The column with the larger amplitude is the aggressor, and the column with the smaller amplitude is the victim.

Additionally, the reference signal RMP gradually increases over the period of AD conversion. When the reference signal RMP is the minimum (i.e., at start of AD conversion), the gate voltage VI decreases as the amplitude increases, and the gate-source voltage of the differential transistor 332 increases as the gate voltage Vi decreases. That is, the larger the amplitude, the larger the gate-source voltage of the differential transistor 332.

When the amplitude is very large, most of the tail current of the tail current source 331 flows to the differential transistor 332 side due to the increase of the gate-source voltage of the differential transistor 332. Then, although it is a differential pair, the differential transistor 332 behaves almost like a source follower. In other words, if the gate voltage Vi changes in that state, the drain voltage 72 hardly changes, while the source voltage Vtail is almost linked to the gate voltage V1. Since the source voltage Vtail is almost linked to the gate voltage V1, charging and discharging of the parasitic capacitance between the gate and source of the differential transistor 332 does not occur. Accordingly, the effective capacitance of the differential transistor 332 as seen from the DAC 212 can be considered as the parasitic capacitance between the gate and drain of the differential transistor 332.

Figure 8:
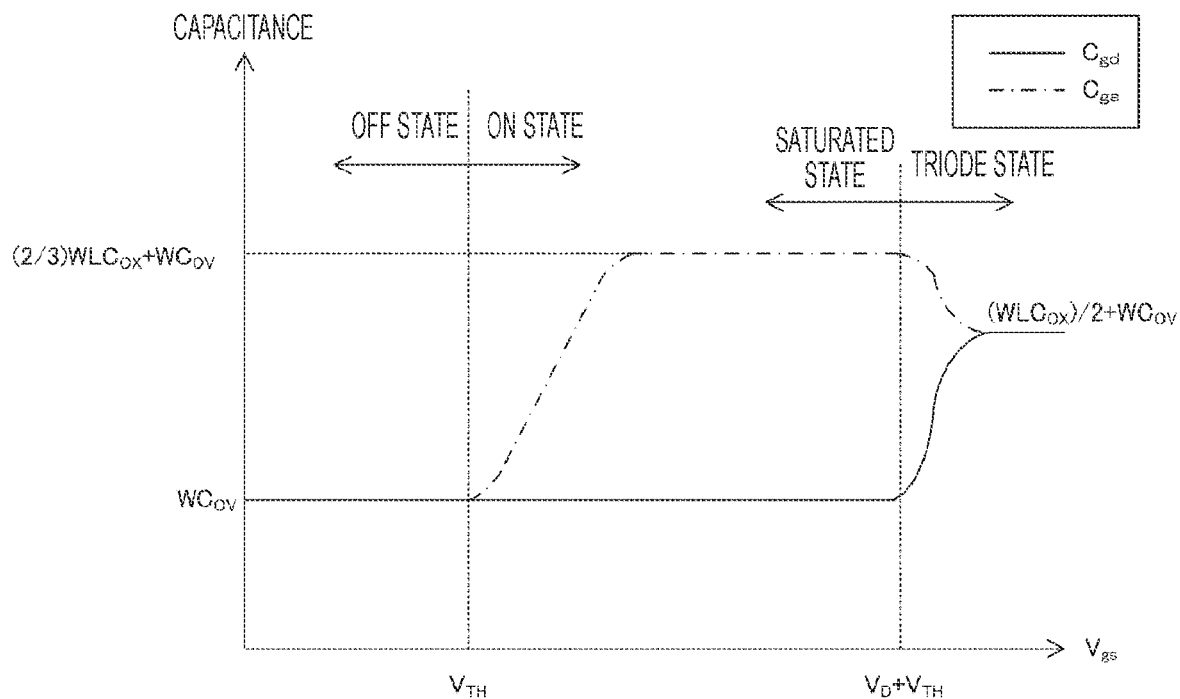
FIG. 8 is a graph showing an example of the characteristics of a metal-oxide-semiconductor (MOS) transistor of the first embodiment of the present technology.

FIG. 8 is a graph showing an example of the characteristics of the MOS transistor in the first embodiment of the present technology. In FIG. 8, the vertical axis represents the capacitance and the horizontal axis represents a gate-source voltage $V_{gs}$. Additionally, the solid line in FIG. 8 indicates the characteristics of a parasitic capacitance Co between the gate and drain of the MOS transistor, and the alternate long and short dash line indicates the characteristics of a parasitic capacitance $C_{gs}$ between the gate and source of the MOS transistor.

When a gate-source voltage $V_{gs}$ exceeds a threshold voltage $V_{TH}$ of the MOS transistor, the MOS transistor shifts to a state called a saturated state, and the parasitic capacitance $C_{gs}$ increases. As the threshold voltage $V_{TH}$ increases, the parasitic capacitance $C_{gs}$ saturates. Then, when the gate-source voltage $V_{gs}$ exceeds the sum of a drain voltage $V_D$ and the threshold voltage $V_{TH}$, the MOS transistor shifts to a state called a three-pole state. During the transition to this three-pole state, the parasitic capacitance $C_{gs}$ decreases while the parasitic capacitance $C_{gd}$ increases.

As mentioned above, the effective capacitance of the differential transistor 332 is the parasitic capacitance $C_{gd}$ between the gate and drain of the differential transistor 332. For this reason, when the amplitude of the aggressor is very large and the differential transistor 332 shifts to the three-pole state, the effective capacitance (parasitic capacitance $C_{gd}$) of the differential transistor 332 as seen from the DAC 212 increases.

Figure 9:
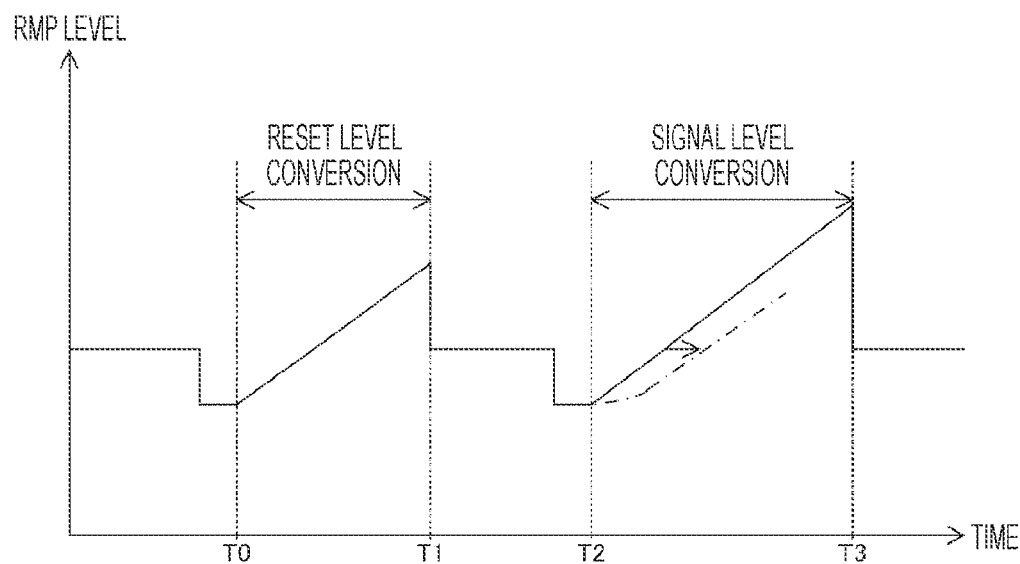
FIG. 9 is a timing chart showing an example of fluctuation of a reference signal in the comparative example.

FIG. 9 is a timing chart showing an example of fluctuation of the reference signal RMP in the comparative example. The reference signal RMP Gradually increases from the initial value over the reset level conversion period from timing T0 to T1. Additionally, the reference signal RMP gradually increases from the initial value over the signal level conversion period from timing T2 to T3.

In the comparative example, when the differential transistor 332 shifts to the three-pole state and the capacitance (parasitic capacitance $C_{gd}$) seen from the DAC 212 increases, the time constant of the load of the DAC 212 increases. As a result, the rising speed of the reference signal RMP becomes slow as indicated by the alternate long and short dash line in FIG. 9, and the time until the signal level comparison result Vout of each column is inverted is delayed. Since the inversion timing of the signal level is delayed while the inversion timing of the reset level does not change, an error occurs in the digital signal after the CDS processing, and the image quality of the image data deteriorates.

The delay in inversion timing due to the increase in parasitic capacitance occurring in the aggressor occurs not only in the aggressor but also in the victim. For this reason, in the comparative example, whitening streaking occurs when the illuminance is high, for example. In order to curb the increase in parasitic capacitance, the amplitude of the pixel signal may be reduced, but this is not preferable because the dynamic range will be reduced.

Here, the transition to the three-pole state occurs when the amplitude of the pixel signal Vin is approximately $Ac^{-1} \cdot |V_{thp}|$ volts (V). Note, however, that strictly speaking, the amplitude is slightly smaller than this due to the rise of the drain voltage V2.

The above-mentioned $V_{thp}$ is the threshold voltage of the P-type differential transistor 332. Additionally, Ac is a transmission gain (so-called auto-zero gain) from the vertical signal line 229$_n$, to the node of the gate voltage V1. Err example, in a case where the auto-zero gain is 0 decibels (dB) and the input capacitance for the pixel signal yin and the input capacitance for the reference signal RMP are substantially the same, the transmission gain Ac is about 0.5. Since the transmission gain is actually attenuated a little more due co other parasitic capacitances, it is considered that the transmission gain Ac will be reduced to about 0.4 in the case of the above settings.

Intuitively speaking, in. order to make the differential transistor 332 transition to the triode state, a node with the Gate voltage V1 only needs to receive a signal of about $|V_{thp}|$ volts (V). However, considering the capacitive voltage divider of the voltage divider circuit 340, it is necessary to input $Ac^{-1} \cdot |V_{thp}|$ volts (V) to compensate for the attenuation.

Accordingly, streaking occurs in a case where the amplitude of the pixel signal Vin exceeds $Ac^{-1} \cdot |V_{thp}|$ volts W).

Hence, in order to curb the occurrence of streaking, it is proposed to add the control transistor 336. The point is that the control transistor 336 does not operate and has no effect in the auto-zero state that determines the characteristics of the comparator 330, and operates so as to decrease the drain voltage V2 to curb entry into the triode state only when the amplitude of the pixel signal Vin is large.

In the comparative example in which the control transistor 336 is not provided, a drain-gate voltage $Vd_{dg}$ of the differential transistor 332 is expressed by the following equation.

$$V_{dg} = V_{gsn} - V_{gs0} + Ac \cdot \Delta V_{VSL}$$
$$\approx Ac \cdot \Delta V_{VSL} + (2^{1/2} - 1) \cdot V_{ODn0}$$
$$\approx Ac \cdot \Delta V_{VSL} + 0.4 \times V_{ODn0}$$

Equation 1

In the above equation, $V_{gsn}$ is the gate-source voltage of the N-type current mirror transistor 337 at the time of signal level input. $V_{gs0}$ is the gate-source voltage of the current mirror transistor 337 at auto-zero. $\Delta V_{VSL}$ is the amplitude of the pixel signal Vin. $V_{ODn0}$ is the overdrive voltage (in other words, pinch-off voltage) of the current mirror transistor 337.

Additionally, in Equation 1, it is assumed that when the amplitude of the pixel signal Vin is sufficiently large, a current about twice as much as that at auto-zero flows through the differential transistor 332. Therefore, when the following equation holds, the differential transistor 332 shifts to the triode state, resulting in a capacitance change.

$$Ac \cdot \Delta V_{VSL} + 0.4 \times V_{ODn0} > |V_{thp}|$$

Equation 2

By transforming Equation 2, the following equation is obtained.

$$\Delta V_{VSL} > Ac^{-1} \cdot (|V_{thp}| - 0.4 \times V_{ODn0}) \quad \text{Equation 3}$$

On the other hand, consider the case where the control transistor 336 is added. Assuming that the amplitude of the pixel signal Vin is large and the load resistance (on-resistance) of the control transistor 336 is sufficiently smaller than the on-resistance of the current mirror transistor 337 at that time, the following equation holds.

$$V_{dg} \approx V_{sg3} \approx V_{ODp3} + |V_{thp3}| \quad \text{Equation 4}$$

In the above equation, $V_{sg3}$ is the source-gate voltage of the control transistor 336. $V_{ODp3}$ is the overdrive voltage of the control transistor 336. $V_{thp3}$ is the threshold voltage of the control transistor 336.

From Equation 4, in order to keep the differential transistor 332 from entering the triode state and maintain the saturated state, it is only required to satisfy the following equation.

$$V_{ODp3} + |V_{thp3}| < |V_{thp}| \quad \text{Equation 5}$$

By transforming Equation 5, the following equation is obtained.

$$|V_{thp}| - |V_{thp3}| - V_{ODp} = -\Delta|V_{thp}| - V_{ODp3} > 0$$

Note, however, that due to the back bias effect of the P-type differential transistor 332, $\Delta|V_{thp}|$ is often greater than zero, and the overdrive voltage $V_{ODp3}$ is also greater than zero, as a matter of course. For this reason, entry of the differential transistor 332 into the triode state cannot be prevented completely. However, by making both of these parameters as close to zero as possible, it is still possible to stop the entry of the differential transistor 332 into the triode state at a slight amount.

Specifically, for the control transistor 336, an element or transistor size with as small a $\Delta|V_{thp}|$ as possible is selected. Alternatively, the overdrive voltage $V_{ODp3}$ may be made as small as possible by increasing the aspect ratio as much as possible, for example. Note that if this control transistor 336 is added, its gate capacitance can reduce the auto-zero gain Ac of the comparator 330 and increase the voltage conversion noise of the pixel signal. Accordingly, the gate area of the control transistor 336 should be kept sufficiently small compared to the differential transistor 332. At the same time, the control transistor 336 should be laid out so as to share the drain and source with the differential transistor 332 by setting the same gate widths, for example, to minimize the increase in parasitic capacitance.

Note that since the control transistor 336 is turned off near the auto-zero point, which is the vicinity of the inversion of the comparison result Vout, it can be expected that the control transistor 336 has almost no adverse effect. Additionally, since $\Delta|V_{thp}|$ is the difference in the threshold voltage between the same pMOS transistors, a certain level of robustness can be expected even for corner conditions such as imbalance between the nMOS transistor and the pMOS transistor.

FIG. 10 is a graph showing an example of the relationship between the amplitude and the node voltage in the first embodiment of the present technology and the comparative example. In FIG. 10, a is a graph showing an example of the relationship between the amplitude and the node voltage in the comparative example without the control transistor 336. In FIG. 10, b is a graph showing an example of the relationship between the amplitude and the node voltage in the first embodiment with the control transistor 336. Additionally, the horizontal axis in FIG. 10 represents an amplitude $\Delta V_{VSL}$ of the pixel signal Vin. The amplitude $\Delta V_{VSL}$ is the difference between the reset level Vinp and signal level Vind of the pixel signal Vin. The vertical axis in FIG. 10 represents the node voltage. The solid line indicates the characteristics of the source voltage Vtail, and the alternate long and short dash line indicates the characteristics of the drain voltage V2.

As illustrated in a of FIG. 10, in the comparative example, as the amplitude $\Delta V_{VSL}$ increases, the source voltage Vtail decreases until it reaches a constant value close to the drain voltage V2. On the other hand, the drain voltage V2 constant. Then, when the amplitude $\Delta V_{VSL}$ exceeds the value when the source voltage Vtail reaches the constant value, the differential transistor 332 shifts to the triode state, and the parasitic capacitance increases.

On the other hand, in the case where the control transistor 336 is added, as illustrated in b of FIG. 10, the control transistor 336 shifts to the ON state when the source voltage Vtail reaches a value close to the drain voltage V2. Then, as the drain current flows on the control transistor 336 side, the source voltage Vtail and the drain voltage V2 decrease as the amplitude $\Delta V_{VSL}$ increases. Since this decrease in the source voltage Vtail reduces the gate-source voltage of the differential transistor 332, the differential transistor 332 can be maintained in. the saturated state. As a result, streaking due to an increase in parasitic capacitance can be curbed.

In summary, the voltage divider circuit supplies a divided voltage of the input pixel signal Vin voltage and the predetermined reference signal RMP voltage as the gate voltage V1. The differential transistor 332 outputs a drain current corresponding to the gate-source voltage between the gate voltage V1 input to the gate and the predetermined source voltage Vtail. Additionally, the differential transistor 333 outputs a voltage corresponding to the drain current from the drain as the comparison result Vout of the pixel signal and the reference signal.

Additionally, the control transistor 336 reduces the drain voltage V2 when the amplitude $\Delta V_{VSL}$ is larger than the value when the source voltage Vtail comes close to the drain voltage V2 (in other words, when signal level of pixel signal is lower than predetermined value). As a result, the gate-source voltage of the differential transistor 332 decreases, and an increase in parasitic capacitance of the transistor can be curbed.

Note that while a pMOS transistor is used as the control transistor 336, an nMOS transistor can also be used as described later. In this case, when the signal level of the pixel signal Vin is higher than a predetermined value, the control transistor 336 increases the drain voltage V2 and reduces the gate-source voltage of the differential transistor 332.

Summarizing the case where the control transistor 336 is an nMOS transistor and the case where the control transistor 336 is a pMOS transistor, in a case where the pixel signal Vin is out of a predetermined range, the control transistor 336 reduces the gate-source voltage of the differential transistor 332.

As described above, according to the first embodiment of the present technology, in a case where the pixel signal Vin is out of the predetermined range, the control transistor 336 reduces the gate-source voltage of the differential transistor 332. Hence, an increase in parasitic capacitance of the differential transistor 332 can be curbed. As a result, streaking due to an increase in parasitic capacitance can be prevented and the image quality of image data can be improved.

2. Second Embodiment

In the first embodiment described above, in addition to the P-type differential transistor 332 and the like, the N-type current mirror transistor 337 and the like are provided in the comparator 330. However, in such a configuration in which the pMOS transistor and the nMOS transistor are mixed, the manufacturing cost may increase as compared with a case where only one of them is arranged. A comparator 330 of the second embodiment differs from the first embodiment in that a resistor is arranged instead of the nMOS transistor.

Figure 11:
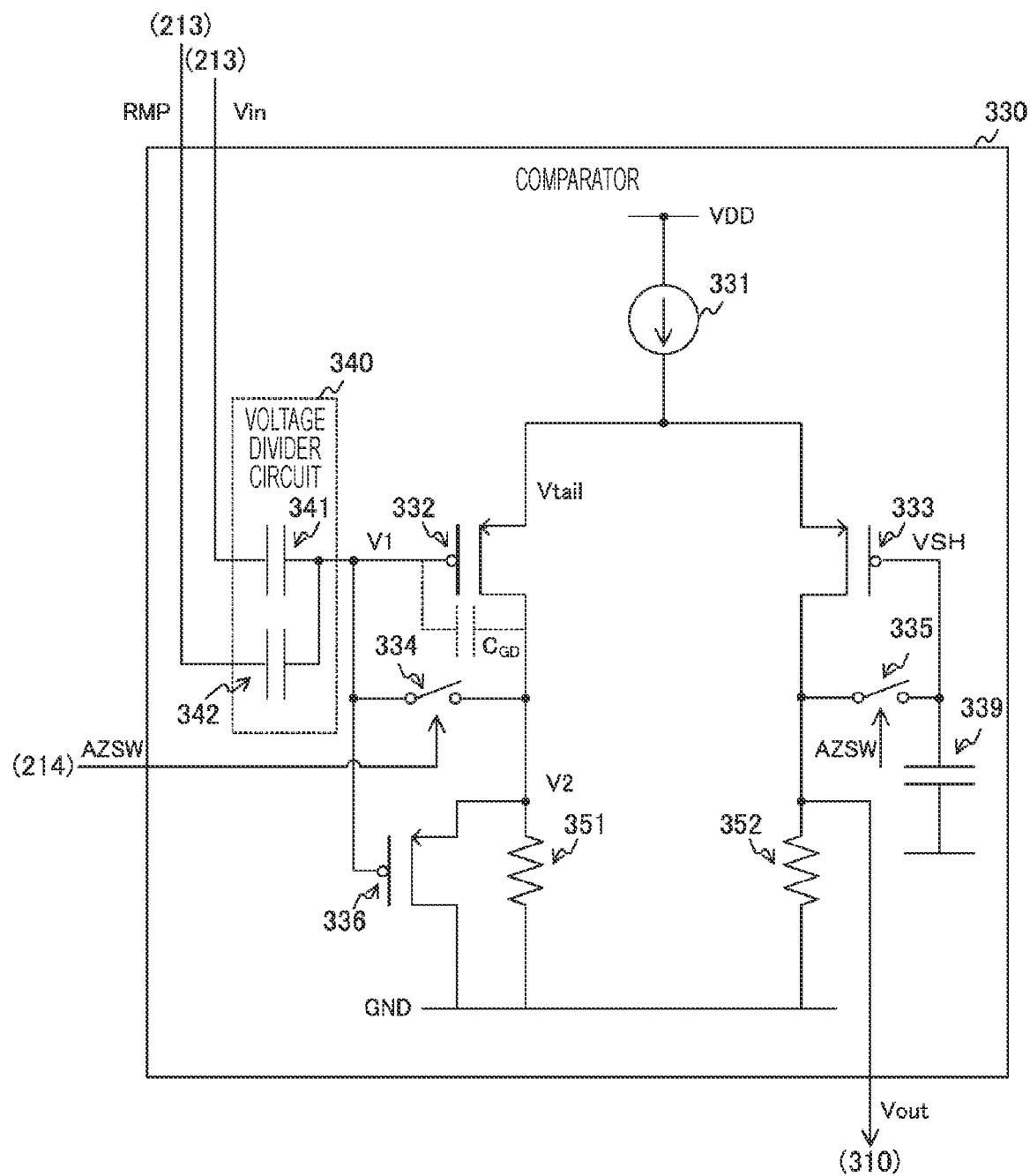
FIG. 11 is a circuit diagram showing a configuration example of a comparator of a second embodiment of the present technology.

FIG. 11 is a circuit diagram showing a configuration example of the comparator 330 of the second embodiment of the present technology. The comparator 330 of the second embodiment differs from the first embodiment in that resistors 351 and 352 are arranged instead of the current mirror transistors 337 and 338.

One end of the resistor 351 is connected to the drain of a differential transistor 332, and one end of the resistor 352 is connected to the drain of a differential transistor 333. The other ends of the resistors 351 and 352 are connected to terminals at a reference potential (e.g., ground potential). Note that the resistor 351 is an example of an input-side resistor described in the claims, and the resistor 352 is an example of an output-side resistor described in the claims.

Since the N-type current mirror transistors 337 and 338 are eliminated, only P-type transistors are available. For this reason, as compared with the case where the pMOS transistor and the nMOS transistor are mixed, the number of steps for forming the transistor can be reduced, and the manufacturing cost of a solid-state image sensor 200 can be reduced.

As described above, according to the second embodiment of the present technology, since the resistors 351 and 352 are connected to the differential transistors 332 and 333, the transistor in the comparator 330 can be limited to the pMOS transistor. As a result, the number of steps for forming the transistor can be reduced, and the manufacturing cost can be reduced.

3. Third Embodiment

In the first embodiment described above, the current mirror transistors 337 and 338 are directly connected to the differential transistors 332 and 333. However, it may be difficult to reduce power consumption sufficiently with this configuration. A comparator 330 of the third embodiment differs from the first embodiment in that a resistor is added to reduce the minimum operating power supply voltage and reduce power consumption.

Figure 12:
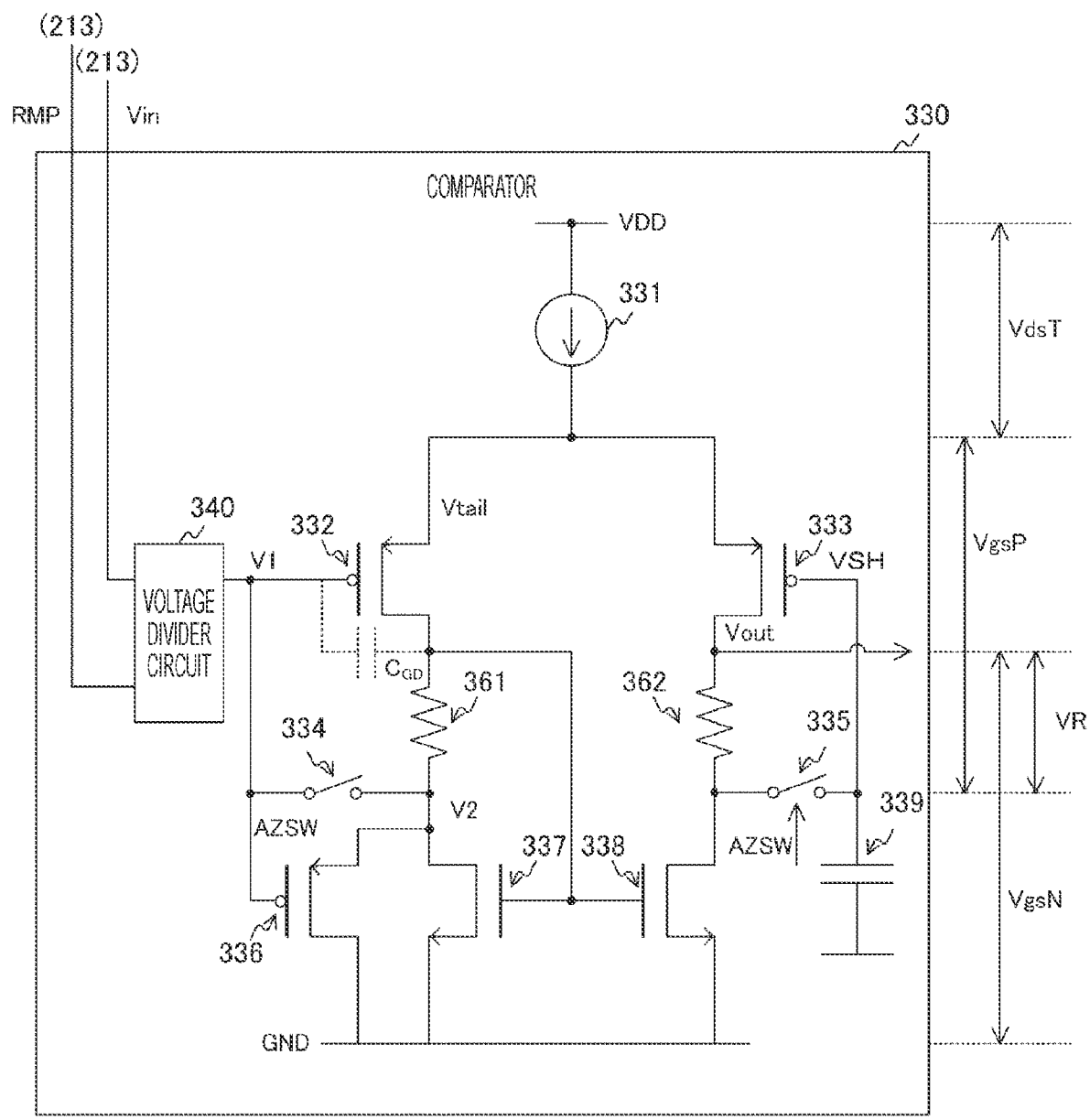
FIG. 12 is a circuit diagram showing a configuration example of a comparator of a third embodiment of the present technology.

FIG. 12 is a circuit diagram showing a configuration example of the comparator 330 of the third embodiment of the present technology. The comparator 330 of the third embodiment differs from the first embodiment in that resistors 361 and 362 are further provided.

One end of the resistor 361 is connected to the drain of a differential transistor 332, and the other end of the resistor 361 is connected to the drain of a current mirror transistor 337. One end of the resistor 362 is connected to the drain of a differential transistor 333, and the other end of the resistor 362 is connected to the drain of a current mirror transistor 338. Note that the resistor 361 is an example of the input-side resistor described in the claims, and the resistor 362 is an example of the output-side resistor described in the claims.

Additionally, the gate of the current mirror transistor 337 is connected to the connection point of the resistor 361 and the differential transistor 332. An auto-zero switch 334 short-circuits the gate of the differential transistor 332 with the connection point of the resistor 361 and the current mirror transistor 337. An auto-zero switch 335 short-circuits the gate of the differential transistor 333 with the connection point of the resistor 362 and the current mirror transistor 338.

Additionally, the source of the control transistor 336 is connected to the connection point of the resistor 361 and the current mirror transistor 337.

In the above configuration, a power supply voltage VDD1 when the auto-zero switches 334 and 335 are closed is expressed by the following equation.

$$VDD1 = VdsT + VgsP + VgsN - VR \quad \text{Equation 6}$$

In the above equation, VdsT is the drain-source voltage of the tail current source 331 implemented by a pMOS transistor. VgsP is The gate-source voltage of P-type differential transistors 332 and 333 during auto-zero operation. VgsN is the gate source voltage of the N-type current mirror transistors 337 and 338. VR is the voltage between terminals of each of the resistors 361 and 362.

On the other hand, in the first embodiment in which the resistors 361 and 362 are not provided, the power supply voltage VDDI when the auto-zero switches 334 and 335 are closed is expressed by the following equation.

$$VDD1 = VdsT + VgsP + VgsN \quad \text{Equation 7}$$

As exemplified in Equations 6 and 7, by providing the resistors 361 and 362, it is possible to reduce the minimum power supply voltage VDDI that enables normal operation of the differential amplifier circuit. As a result, power consumption of the comparator 330 can be reduced.

Figure 13:
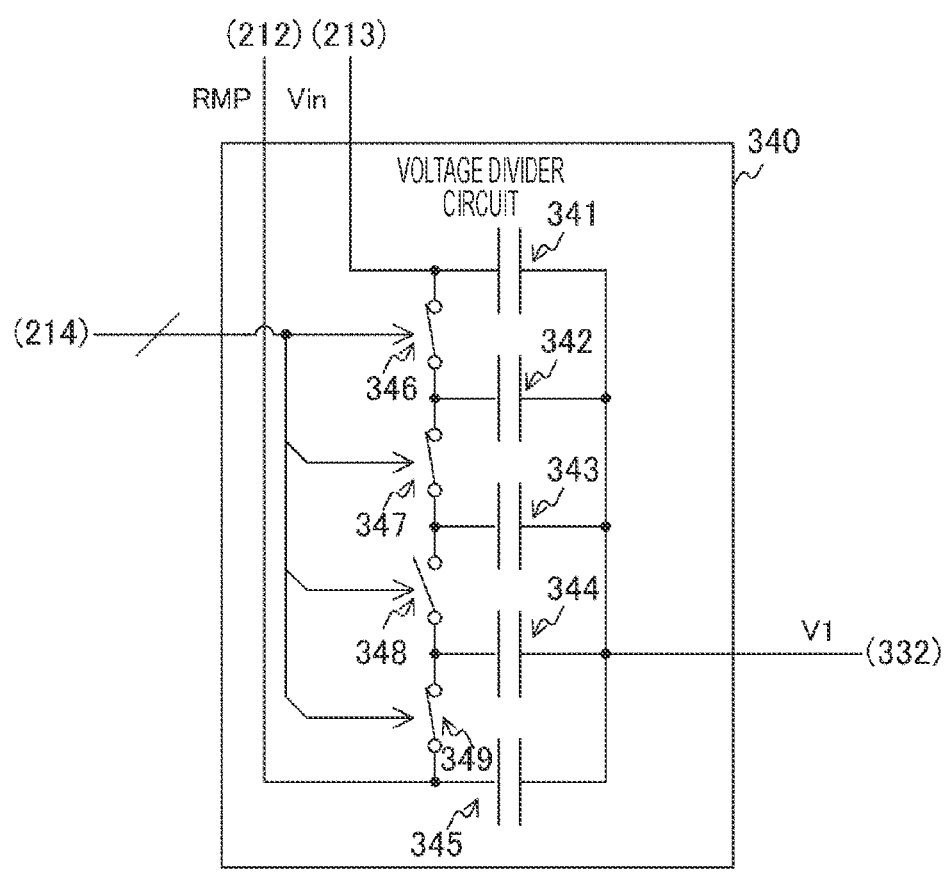
FIG. 13 is a circuit diagram showing a configuration example of a voltage divider circuit of the third embodiment of the present technology.

FIG. 13 is a circuit diagram showing a configuration example of a voltage divider circuit 340 of the third embodiment of the present technology. The voltage divider circuit 340 of the third embodiment includes capacitors 341 to 345 and switches 346 to 349.

One ends of the capacitors 341 to 345 are commonly connected to the gate of the differential transistor 332. The other end of the capacitor 341 is connected to a pixel array unit 213, and the other end of the capacitor 345 is connected to a DAC 212.

The switch 346 opens and closes the path between the other end of the capacitor 341 and the other end of the capacitor 342 under the control of a timing controller 214. The switch 347 opens and closes the path between the other end of the capacitor 342 and the other end of the capacitor 343 under the control of the timing controller 214. The itch 348 opens and closes the path between the other end of the capacitor 343 and the other end of the capacitor 344 under the control of the timing controller 214. The switch 349 opens and closes the path. between the other end of the capacitor 344 and the other end of the capacitor 345 under the control of the timing controller 214.

The timing controller 214 can control each of the switches 346 to 349 to change the ratio of the input capacitance on the vertical signal line side to the input capacitance on the DAC 212 side. As a result, the voltage division ratio can be switched as needed.

Note that while five capacitors 341 to 345 are provided, the number of capacitors is not limited to five. Similarly, the number of switches is not limited to four. Additionally, the voltage divider circuit 340 of the third embodiment can be applied to the second embodiment.

As described above, according to the third embodiment of the present technology, since the resistors 361 and 362 are inserted between the differential transistors 332 and 333 and the current mirror circuit, the minimum required power supply voltage VDD can be reduced by the terminal voltage of the resistors 361 and 362. As a result, power consumption of the comparator 330 can be reduced.

4. Fourth Embodiment

In the first embodiment described above, the difference is amplified by a differential amplifier circuit provided with P-type differential transistors 332 and 333. However, with this configuration, the difference cannot be amplified in a case where the signal level of the pixel signal is higher than the reset level. A comparator 330 of the fourth embodiment differs from the first embodiment in that an N-type differential transistor is provided.

Figure 14:
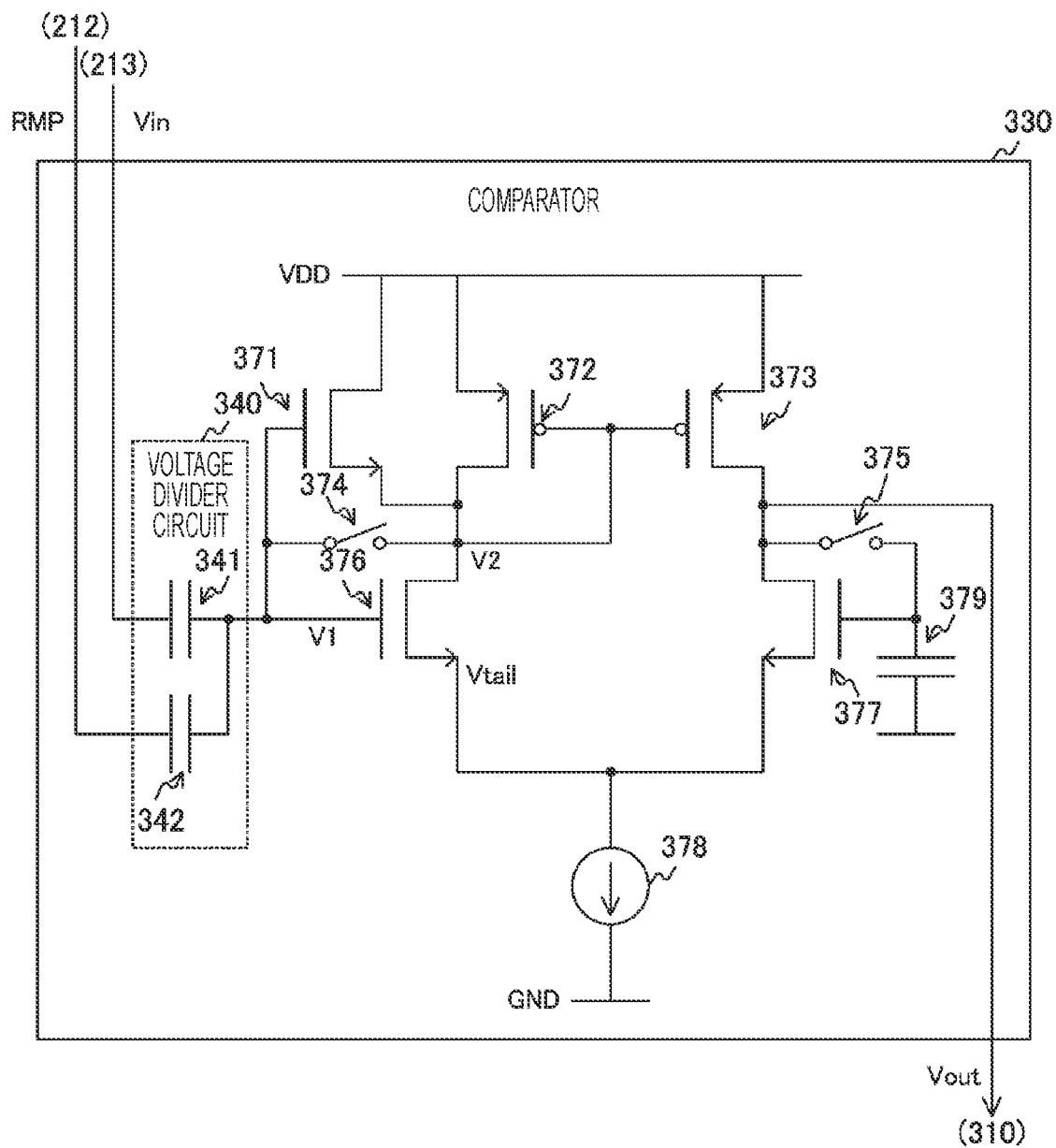
FIG. 14 is a circuit diagram showing a configuration example of a comparator of a fourth embodiment of the present technology.

FIG. 14 is a circuit diagram showing a configuration example of the comparator 330 of the fourth embodiment of the present technology. The comparator 330 of the fourth embodiment includes a control transistor 371, current mirror transistors 372 and 373, auto-zero switches 374 and 375, and differential transistors 376 and 377. Additionally, the comparator 330 further includes a tail current source 378, a capacitor 379, and a voltage divider circuit 340.

As the control transistor 371 and the differential transistors 376 and 377, nMOS transistors are used. Additionally, as the current mirror transistors 372 and 373, pMOS transistors are used.

The control transistor 371 and the current mirror transistor 372 are connected in parallel between a terminal of a power supply voltage VDD and the differential transistor 376. The current mirror transistor 372 is diode connected. The current mirror transistor 373 and the differential transistor 377 are connected in series between the terminal of the power supply voltage VDD and a tail current source 378. The sources of the differential transistors 376 and 377 are commonly connected to the tail current source 378.

Additionally, the gates of the control transistor 371 and the differential transistor 376 are commonly connected to the voltage divider circuit 340. The capacitor 379 is inserted between the gate of the differential transistor 377 and a terminal of a reference potential.

The auto-zero switch 374 short-circuits between the gate and drain of the differential transistor 376 under the control of a timing controller 214. On the other hand, the auto-zero switch 375 short-circuits between the gate and the drain of the differential transistor 377 under the control of the timing controller 214.

Note that the differential transistor 376 is an example of the input-side differential transistor described in the claim. The differential transistor 377 is an example of the output-side differential transistor described in the claims. Additionally, the current mirror transistor 372 is an example of the input-side current mirror transistor described in the claims. The current mirror transistor 373 is an example of the output-side current mirror transistor described in the claims.

In a case where a pixel 220 accumulates positive charge, the signal level will be higher than the reset level. In this case, when the signal level is very high (i.e., amplitude is large), the gate-source voltage of the differential transistor 376 becomes high.

Additionally, when the signal level of a pixel signal Vin is higher than a predetermined value, the control transistor 371 increases a drain voltage V2 and reduces the gate-source voltage of the differential transistor 376. As a result, an increase in the parasitic capacitance of the differential transistor 376 can be curbed.

Note that the second embodiment and the third embodiment can also be applied to the comparator 330 of the fourth embodiment.

As described above, according to the fourth embodiment of the present technology, the N-type control transistor 371 reduces the gate-source voltage of the differential transistor 376. Hence, even when the signal level becomes higher than the reset level, an increase in parasitic capacitance can be curbed.

5. Example of Application to Endoscopic Surgery System

The technology according to the present disclosure can be applied to various products. For example, the technology of the present disclosure may be applied to an endoscopic surgery system.

Figure 15:
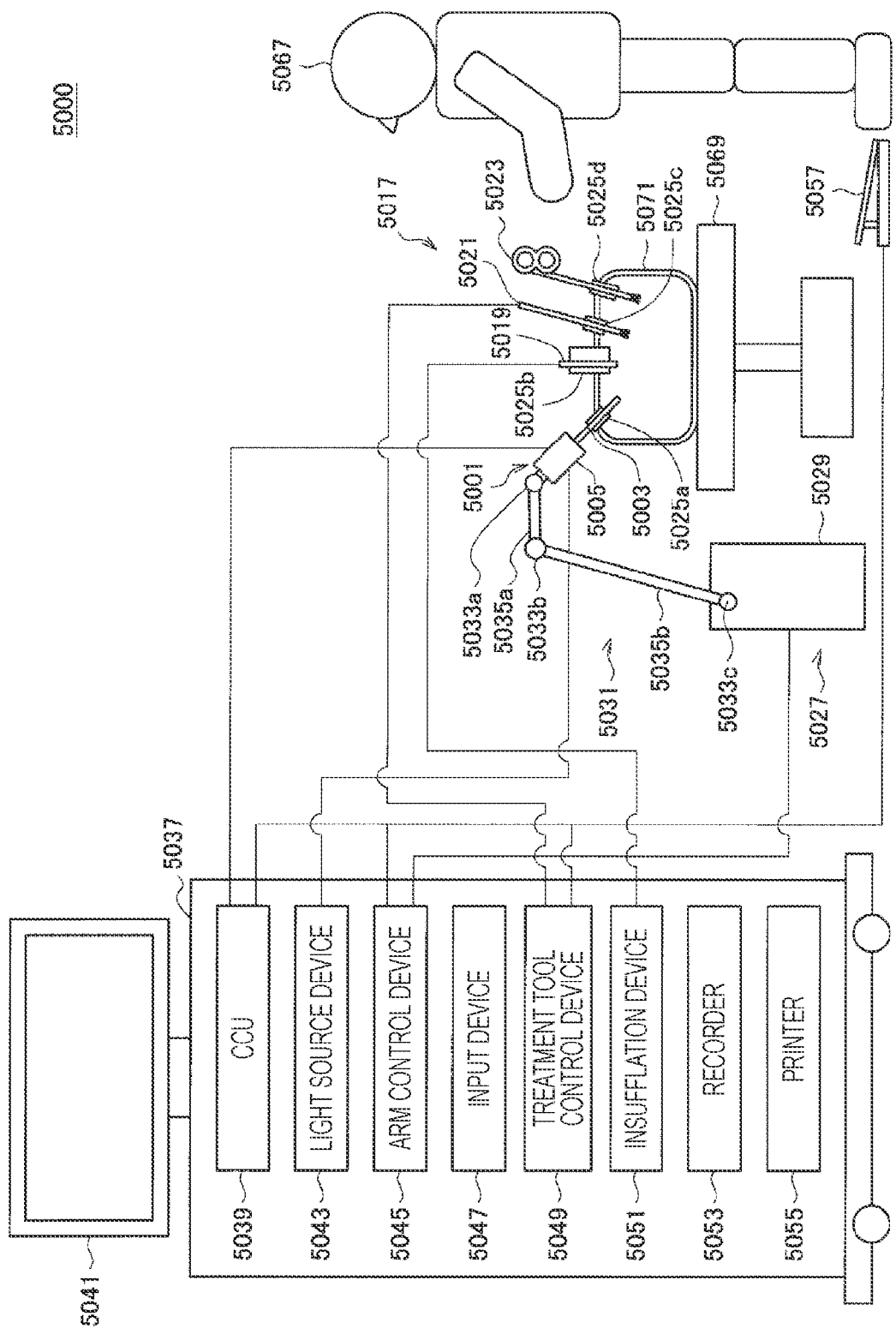
FIG. 15 is a diagram showing as example of a schematic configuration of an endoscopic surgery system.

FIG. 15 is a diagram showing an example of a schematic configuration of an endoscopic surgery system 5000 to which the technology of the present disclosure can be applied. FIG. 15 shows a state in which an operator (surgeon) 5067 is performing a surgery on a patient 5071 on a patient bed 5069 using the endoscopic surgery system 5000. As shown in FIG. 15, the endoscopic surgery system 5000 includes an endoscope 5001, other surgical tools 5017, a support arm device 5027 that supports the endoscope 5001, and a cart 5037 on which various devices for endoscopic surgery are mounted.

In endoscopic surgery, instead of cutting the abdominal wall to open the abdomen, tubular opening devices called trocars 5025a to 5025d are punctured multiply in the abdominal wall. Then, a lens barrel 5003 of the endoscope 5001 and the other surgical tools 5017 are inserted into the body cavity of the patient 5071 from the trocars 5025a to 5025d. In. the example shown in. FIG. 15, an insufflation tube 5019, an energy treatment tool 5021, and forceps 5023 are inserted into the body cavity of the patient 5071 as the other surgical tools 5017. Additionally, the energy treatment tool 5021 is a treatment tool that performs incision and peeling of tissue, sealing of blood vessels, or the like by high-frequency current or ultrasonic vibration. Note, however, that the illustrated surgical tools 5017 are merely an example, and various surgical tools generally used in endoscopic surgery, such as tweezers and a retractor, may be used as the surgical tools 5017.

An image of the surgical site in the body cavity of the patient 5071 captured by the endoscope 5001 is displayed on a display device 5041. The operator 5067 uses the energy treatment tool 5021 and the forceps 5023 while viewing in real time the image of the surgical site displayed on the display device 5041, and performs treatment such as excising the affected area. Note that although illustration is omitted, the insufflation tube 5019, the energy treatment tool 5021, and the forceps 5023 are supported by the operator 5067, an assistant, and the like during surgery.

Support Arm Device

The support arm device 5027 includes an arm portion 5031 extending from a base portion 5029. In the example shown in FIG. 15, the arm portion 5031 includes joint portions 5033a, 5033b, and 5033c, and links 5035a and 5035b, and is driven by control from an arm control device 5045. The arm portion 5031 supports the endoscope 5001, and controls its position and posture. As a result, the position of the endoscope 5001 can be stably fixed.

Endoscope

The endoscope 5001 includes the lens barrel 5003 whose area of a predetermined length from the tip end is inserted into the body cavity of the patient 5071, and a camera head 5005 connected to the base end of the lens barrel 5003. While FIG. 15 shows an example in which the endoscope 5001 is configured as a so-called rigid endoscope having a hard lens barrel 5003, the endoscope 5001 may be configured as a so-called flexible endoscope having a soft lens barrel 5003.

An opening into which an objective lens is fitted is provided at the tip end of the lens barrel 5003. light source device 5043 is connected co the endoscope 5001, and light generated by the light source device 5043 is guided to the tip end of the lens barrel by a light guide extending inside the lens barrel 5003. The light is radiated toward the observation target in the body cavity of the patient 5071 through the objective lens. Note that the endoscope 5001 may be a forward-viewing endoscope, an oblique-viewing endoscope, or a side-viewing endoscope.

An optical system and an image sensor are provided inside the camera head 5005, and reflected light (observation light) from an observation target is focused on the image sensor by the optical system. Observation light is photoelectrically converted by the image sensor, and an electric signal corresponding to the observation light, that is, an image signal corresponding to the observed. image is generated. The image signal is transmitted to a camera control unit (CCU) 5039 as RAW data. Note that the camera head 5005 has a function of adjusting the magnification and the focal length by appropriately driving the optical system.

Note that the camera head 5005 may be provided with multiple image sensors in order to support stereoscopic viewing (3D display), for example. In this case, multiple relay optical systems are provided inside the lens barrel 5003 in order to guide the observation light to each of the multiple image sensors.

Various Devices Mounted on Cart

The CCU 5039 includes a central processing unit (CPU), a graphics processing unit (CPU), and the like, and performs centralized control of operations of the endoscope 5001 and the display device 5041. Specifically, the CCU 5039 performs, on an image signal received from the camera head 5005, various image processing for displaying an image based on the image signal, such as development processing (demosaicing processing). The CCU 5039 provides the image signal subjected to the image processing to the display device 5041. Additionally, the CCU 5039 sends a control signal to the camera head 5005 to control driving thereof. The control signal may include information regarding imaging conditions such as magnification and focal length.

The display device 5041 displays an image based on the image signal subjected to image processing by the CCU 5039 under the control of the CCU 5039. In a case where the endoscope 5001 is compatible with high-resolution imaging such as 4K (horizontal pixel 3840×vertical pixel 2160) or 8K (horizontal pixel 7680×vertical pixel 4320) , and/or 3D display, a device capable of high-resolution display and/or a device capable of 3D display can be used as the display device 5041 corresponding to each endoscope 5001. In the case where the display device 5041 is compatible with high-resolution imaging such as 4K or 8K, a more immersive feeling can be obtained by using a display device 5041 having a size of 55 inches or more. Additionally, multiple display devices 5041 having different resolutions and sizes may be provided depending on the application.

The light source device 5043 includes a light source such as a light emitting diode (LED), for example, and supplies irradiation light for imaging a surgical site to the endoscope 5001.

The arm control device 5045 includes a processor such as a CPU, for example, and operates according to a predetermined program to control driving of the arm portion 5031 of the support arm device 5027 according to a predetermined control method.

The input device 5047 is an input interface for the endoscopic surgery system 5000. The user can input various information and instructions to the endoscopic surgery system 5000 through the input device 5047. For example, the user inputs various kinds of information regarding the surgery, such as physical information of the patient and information regarding the surgical procedure, through the input device 5047. Additionally, for example, the user inputs, through the input device 5047, an instruction to drive the arm portion 5031, an instruction to change the imaging conditions (type of irradiation light, magnification, focal length, and the like) of the endoscope 5001, an instruction to drive the energy treatment tool 5021, and the like.

The type of the input device 5047 is riot limited, and the input device 5047 may be various known input devices. As the input device 5047, a mouse, a keyboard, a touch panel, a switch, a foot switch 5057 and/or a lever can be applied, for example, in the case where a touch panel is used as the input device 5047, the touch panel may be provided on the display surface of the display device 5041.

Alternatively, the input device 5047 is a device worn by the user, such as an eyeglass-type wearable device or a head mounted display (HMD), and various inputs are performed according to the user's gesture or line-of-sight detected by these devices. Additionally, the input device 5047 includes a camera capable of detecting the movement of the user, and various inputs are performed according to the user's gesture or line-of-sight detected from an image captured by the camera. Moreover, the input device 5047 includes a microphone capable of collecting the voice of the user, and various inputs are performed by voice through the microphone. As described above, since the input device 5047 is capable of inputting various information in a contactless manner, a user (e.g., operator 5067) who belongs co a clean area, in particular, can operate devices belonging to an unclean area in a contactless manner. Additionally, the user can operate the devices without releasing his/her hand from the surgical tool, which is convenient for the user.

A treatment tool control device 5049 controls driving of the energy treatment tool 5021 for tissue ablation, incision, blood vessel sealing, or the like. In order to inflate the body cavity of the patient 5071 for the purpose of securing the visual field of the endoscope 5001 and securing the operator's workspace, an insufflation device 5051 is used to send gas into the body cavity through the insufflation tube 5019. A recorder 5053 is a device capable of recording various information related to surgery. A printer 5055 is a device capable of printing various information related to surgery in various formats such as text, images, or graphs.

Hereinafter, a particularly characteristic configuration of the endoscopic surgery system 5000 will be described in more detail.

Support Arm Device

The support arm device 5027 includes the base portion 5029, which is a base, and the arm portion 5031 extending from the base portion 5029. While the arm portion 5031 of the example shown in FIG. 15 includes the multiple joint portions 5033a, 5033b, and 5033c and the multiple links 5035a and 5035b connected by the joint portion 5033b, in FIG. 15, for simplicity, the configuration of the arm portion. 5031 is shown in a simplified manner. In practice, the shapes, the number, and the arrangement of the joint portions 5033a to 5033c and the links 5035a and 5035b, the directions of the rotation axes of the joint portions 5033a to 5033c, and the like may be appropriately set to achieve a desired degree of freedom for the arm portion 5031. For example, the arm portion 5031 may be suitably configured to have six or more degrees of freedom. As a result, the endoscope 5001 can be freely moved within the movable range of the arm portion 5031, so that the lens barrel 5003 of the endoscope 5001 can be inserted into the body cavity of the patient 5071 from a desired direction.

The joint portions 5033a to 5033c are provided with actuators, and the joint portions 5033a to 5033c are rotatable about predetermined rotation axes by driving the actuators. Driving of the actuator is controlled by the arm control device 5045, whereby the notation angles of The joint portions 5033a to 5033c are controlled and driving of the arm portion 5031 is controlled. As a result, the position and posture of the endoscope 5001 can be controlled. At this time, the arm control device 5045 can control driving of the arm portion 5031 by various known control methods such as force control or position control.

For example, when the operator 5067 inputs an operation appropriately through the input device 5047 (including foot switch 5057), the arm control device 5045 can appropriately control driving of the arm portion 5031 in accordance with the input operation, and control the position and posture of the endoscope 5001. According to This control, the endoscope 5001 at the tip end of the arm portion 5031 can be moved from an arbitrary position to an arbitrary position, and then be fixedly supported at the position to which it is moved. Note that the arm portion 5031 may be operated by a so-called master slave method. In this case, the arm portion 5031 can be remotely operated by the user through the input device 5047 installed at a place away from the operating room.

Additionally, in the case where force control is applied, the arm control device 5045 may perform so-called power assist control in which external force is received from a user, and the actuators of the joint. portions 5033a to 5033c are driven so that the arm portion 5031 moves smoothly according to the external force. As a result, when the user moves the arm portion 5031 while touching the arm portion 5031 directly, he/she can move the arm portion 5031 with a relatively light force. Accordingly, the endoscope 5001 can be moved more intuitively with a simpler operation, which is convenient for the user.

Here, generally, in endoscopic surgery, a surgeon called a scopist supports the endoscope 5001. On the other hand, by using the support arm device 5027, it is possible to fix the position of the endoscope 5001 more reliably without manual labor. Hence, it is possible to obtain an image of the surgical site reliably, and perform the surgery smoothly.

Note that the arm control device 5045 does not necessarily have to be provided on the cart 5037. Additionally, the arm control device 5045 does not necessarily have to be one device. For example, the arm control device 5045 may be provided in each of the joint portions 5033a to 5033c of the arm portion 5031 of the support arm device 5027, and the multiple arm control devices 5045 may cooperate with each other to control driving of the arm portion 5031.

Light Source Device

The light source device 5043 supplies the endoscope 5001 with irradiation light for imaging a surgical site. The light source device 5043 includes an LED, a laser light source, or a white light source including a combination thereof, for example. At this time, in the case where a white light-source is configured by a combination of RGB laser light sources, the output intensity and output timing of each color (each wavelength) can be controlled with high accuracy. Hence, white balance of the captured image can be adjusted in the light source device 5043. Additionally, in this case, it is also possible to capture images corresponding to RGB in a time-division manner, by irradiating the observation target with the laser light from each of the ROB laser light sources in a time-division manner, and controlling driving of the image sensor of the camera head 5005 in synchronization with the irradiation timing. According to this method, a color image can be obtained without providing a color filter in the image sensor.

Additionally, driving of the light source device 5043 may be controlled so as to change the intensity of light to be output every predetermined time. By acquiring images in a time-division manner by controlling driving of the image sensor of the camera head 5005 in synchronization with the timing of the change in the intensity of light and synthesizing the images, a wide-dynamic range image without so-called blackout and overexposure can be generated.

Additionally, the light source device 5043 may be capable of supplying light in a predetermined wavelength band corresponding to special light observation. In special light observation, so-called narrow band imaging is performed in which a predetermined tissue such as a blood vessel on the surface of the mucosa is imaged with high contrast, by utilizing the wavelength dependence of light absorption in body tissue and emitting light in a narrower band compared to irradiation light during normal observation (i.e., white light), for example. Alternatively, in special light observation, fluorescence observation may be performed in which an image is obtained by Fluorescence generated by emitting excitation light. Examples of fluorescence observation include irradiating the body tissue with excitation light and observing fluorescence from the body tissue (autofluorescence observation), or locally injecting a reagent such as indocyanine green (ICG) into the body tissue and irradiating the body tissue with excitation light corresponding to the fluorescence wavelength of the reagent to obtain a fluorescence image, for example. The light source device 5043 may be capable of supplying narrowband light and/or excitation light corresponding to such special light observation.

Camera Head and CCU

Figure 16:
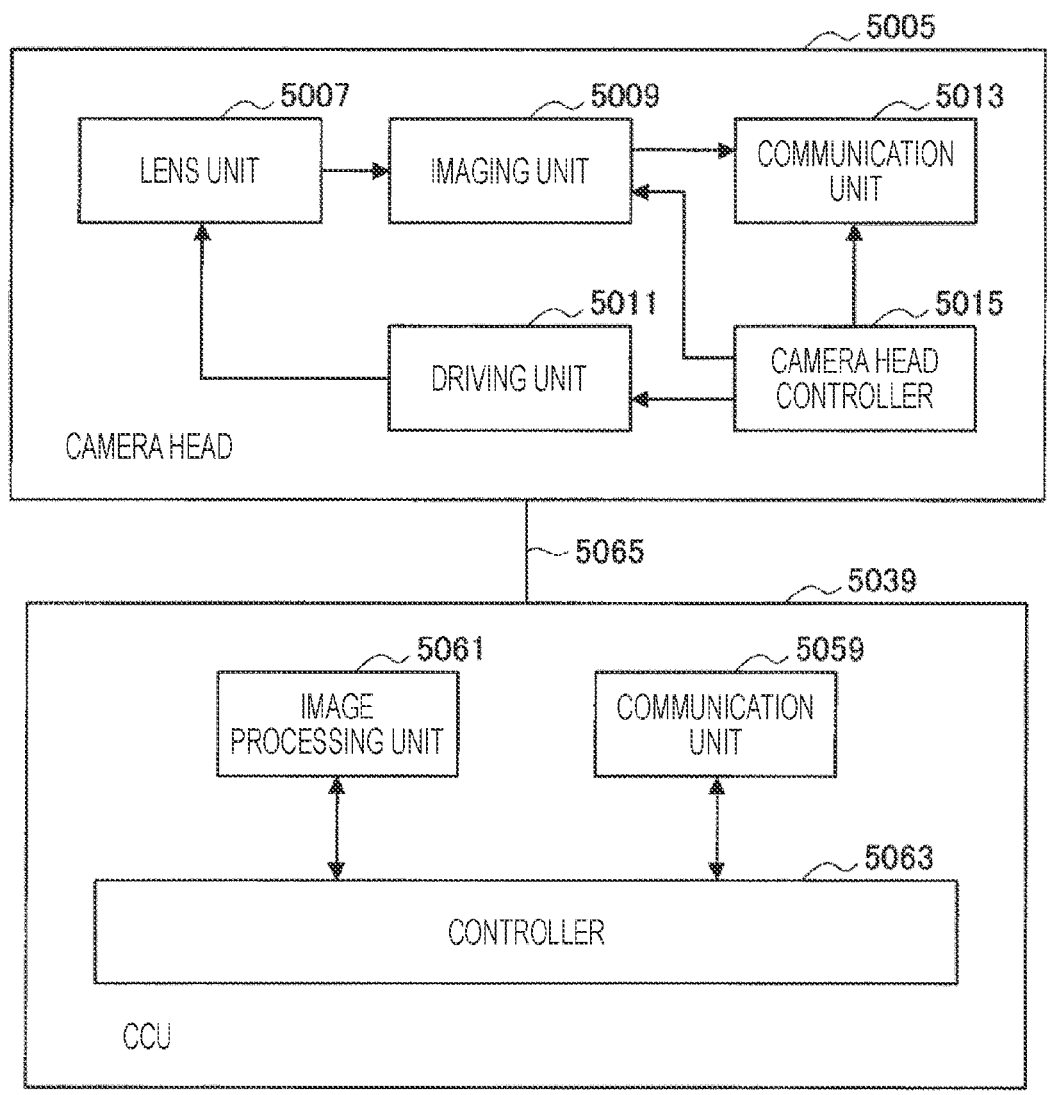
FIG. 16 is a block diagram showing an example of the functional configuration of a camera head and a camera control unit (CCU) shown in FIG. 15.

The functions of the camera head 5005 of the endoscope 5001 and the CCU 5039 will be described in more detail with reference to FIG. 16. FIG. 16 is a block diagram showing an example of a functional configuration of the camera head 5005 and the CCU 5039 shown in FIG. 15.

Referring to FIG. 16, the camera head 5005 has, as its functions, a lens unit 5007, an imaging unit 5009, a driving unit 5011, a communication unit 5013, and a camera head controller 5015. Additionally, the CCU 5039 has, as its functions, a communication unit. 5059, an image processing unit 5061, and a controller 5063. The camera head 5005 and the CCU 5039 are communicably connected to each other by a transmission cable 5065.

First, a functional configuration of the camera head 5005 will be described. The lens unit 5007 is an optical system provided at a connection portion with the lens barrel 5003. Observation light taken in from the tip end of the lens barrel 5003 is guided to the camera head 5005 and enters the lens unit 5007. The lens unit 5007 is configured by combining multiple lenses including a zoom lens and a focus lens. The optical characteristic of the lens unit 5007 is adjusted so that the observation light is focused on the Light receiving surface of an image sensor of the imaging unit 5009. Additionally, the zoom lens and the focus lens are configured so that their positions on the optical axis can be moved in order to adjust the magnification and focus of the captured image.

The imaging unit 5009 includes an image sensor, and is arranged subsequent to the lens unit 5007. The observation light that has passed through the lens unit 5007 is focused on the light receiving surface of the image sensor, and an image signal corresponding to the observation image is generated by photoelectric conversion. The image signal Generated by the imaging unit 5009 is provided to the communication unit 5013.

As the image sensor included in the imaging unit 5009, a complementary metal oxide semiconductor (CMOS) type image sensor, which has a Bayer array and is capable of color imaging, is used, for example. Note that as the image sensor, a device that supports imaging of a high-resolution image of 4K or higher may be used, for example. By obtaining the image of the surgical site with high resolution, the operator 5067 can grasp the state of the surgical site in more detail, and can proceed with the surgery more smoothly.

Additionally, the image sensor included in the imaging unit 5009 has a pair of image sensors for acquiring the image signals for the right eye and the left eye corresponding to 3D display. The 3D display enables the operator 5067 to grasp the depth of the living tissue in the surgical site more accurately. Note that in a case where the imaging unit 5009 is a multi-plate type, multiple lens units 5007 are provided corresponding to the image sensors.

Additionally, the imaging unit 5009 does not necessarily have to be provided in the camera head 5005. For example, the imaging unit 5009 may be provided inside the lens barrel 5003 immediately after the objective lens.

The driving unit 5011 includes an actuator, and moves the zoom lens and the focus lens of the lens unit 5007 by a predetermined distance along the optical axis under the control of the camera head controller 5015. As a result, the magnification and focus of the image captured by the imaging unit 5009 can be adjusted as appropriate.

The communication unit 5013 includes a communication device for transmitting and receiving various information to and from the CCU 5039. The communication unit 5013 transmits the image signal obtained from the imaging unit 5009 as RAW data to the CCU 5039 through the transmission cable 5065. At this time, it is preferable that the image signal is transmitted by optical communication in order to display the captured image of the surgical site with low latency. At the time of surgery, the operator 5067 performs the surgery while observing the condition of the affected area with the captured image. Hence, for safer and more reliable surgery, the dynamic image of the surgical site needs to be displayed as close to real-time as possible. In a case where optical communication is performed, the communication unit 5013 is provided with a photoelectric conversion module that converts an electric signal into an optical signal. The image signal is converted into an optical signal by the photoelectric conversion module and then transmitted to the CCU 5039 through the transmission cable 5065.

Additionally, the communication unit 5013 receives a control signal for controlling driving of the camera head 5005 from the CCU 5039. For example, the control signal includes information regarding imaging conditions such as information that specifies the frame rate of the captured image, information that specifies the exposure value at the time of imaging, and/or information that specifies the magnification and focus of the captured image. The communication unit 5013 provides the received. control signal to the camera head controller 5015. Note that the control signal from the CCU 5039 may also be transmitted by optical communication. In this case, the communication unit 5013 is provided with a photoelectric conversion module that converts an optical signal into an electric signal. The control signal is converted into an electric signal by the photoelectric conversion module, and then provided to the camera head controller 5015.

Note that the imaging conditions such as the frame rate, the exposure value, the magnification, and the focus described above are automatically set by the controller 5063 of the CCU 5039 on the basis of the acquired image signal. That is, the so-called auto exposure (AE) function, auto focus (AF) function, and auto white balance (AWB) function are installed in the endoscope 5001.

The camera head controller 5015 controls driving of the camera head 5005 on the basis of a control signal from the CCU 5039 received through the communication unit. 5013. For example, the camera head controller 5015 controls driving of the image sensor of the imaging unit 5009 on the basis of the information that specifies the frame rate of the captured image and/or the information that specifies the exposure at the time of imaging. Additionally, for example, the camera head controller 5015 appropriately moves the zoom lens and the focus lens of the lens unit 5007 through the driving unit 5011 on the basis of the information that specifies the magnification and the focus of the captured image. The camera head controller 5015 may further include a function of storing information for identifying the lens barrel 5003 and the camera head 5005.

Note that by arranging the lens unit 5007, the imaging unit 5009, and the like in a hermetically sealed and highly waterproof closed structure, the camera head 5005 can be made resistant to autoclave sterilization processing.

Next, a functional configuration of the CCU 5039 will be described. The communication unit 5059 includes a communication device for transmitting and receiving various information to and from the camera head 5005. The communication unit 5059 receives an image signal transmitted from the camera head 5005 through the transmission cable 5065. At this time, as described above, the image signal can be suitably transmitted by optical communication. In this case, to support optical communication, the communication unit 5059 is provided with a photoelectric conversion module that converts an optical signal into an electric signal. The communication unit 5059 provides the image signal converted into the electric signal to the image processing unit 5061.

Additionally, the communication unit 5059 transmits a control signal for controlling driving of the camera head 5005 to the camera head 5005. The control signal may also be transmitted by optical communication. The image processing unit 5061 performs various image processing on the image signal that is RAW data transmitted from the camera head 5005. Examples of the image processing include various known signal processing such as development processing, enhancement processing (e.g., band emphasis processing, super-resolution processing, noise reduction (PR) processing and/or camera shake correction processing), and/or enlargement processing (electronic zoom processing). Additionally, the image processing unit 5061 also performs detection processing on the image signal for performing AE, AF, and AWB.

The image processing unit 5061 includes a processor such as a CPU or a CPU, and the image processing and the detection processing described above can be performed by the processor operating according to a predetermined program. Note that in a case where the image processing unit 5061 includes multiple OPUs, the image processing unit 5061 appropriately divides information related to the image signal and performs image processing in parallel by the multiple GPUs.

The controller 5063 performs various controls related to imaging of the surgical site by the endoscope 5001 and display of the captured image. For example, the controller 5063 generates a control signal for controlling driving of the camera head 5005. At this time, in a case where the imaging conditions are input by the user, the controller 5063 generates a control signal on the basis of the input by the user. Alternatively, in a case where the endoscope 5001 is equipped with an AE function, an AF function, and an AWB function, the controller 5063 appropriately calculates the optimum exposure value, focal length, and white balance depending on the result of the detection processing by the image processing unit 5061, and generates a control signal.

Additionally, the controller 5063 causes the display device 5041 to display an image of the surgical site on the basis of the image signal subjected to image processing by the image processing unit 5061. At this time, the controller 5063 recognizes various objects in the image of the surgical site using various image recognition technologies. For example, the controller 5063 can recognize surgical tools such as forceps, specific biological parts, bleeding, mist when using the energy treatment tool 5021, and the like by detecting the shape, color, and the like of the edge of the object included in the image of the surgical site. When displaying the image of the surgical site on the display device 5041, the controller 5063 superimposes and displays various surgery support information on the image of the surgical site using the recognition result. By superimposing and displaying the surgery support information and presenting it to the operator 5067, it is possible to proceed with the surgery more safely and reliably.

The transmission cable 5065 that connects the camera head 5005 and the CCU 5039 is an electric signal cable supporting electric signal communication, an optical fiber supporting optical communication, or a composite cable thereof.

Here, while communication is performed by wire using the transmission cable 5065 in the example shown in FIG. 16, communion between the camera head 5005 and the CCU 5039 may be performed wirelessly. In a case where the communication between the camera head 5005 and the CCU 5039 is performed wirelessly, it is not necessary to lay the transmission cable 5065 in the operating room. Hence, it is possible to avoid a situation in which the transmission cable 5065 hinders the movement of the medical staff in the operating room.

An example of the endoscopic surgery system 5000 to which the technology of the present disclosure can be applied has been described above. Note that while the endoscopic surgery system 5000 has been described here as an example, the system to which the technology according to the present disclosure can be applied is not limited to such an example. For example, the technology according to the present disclosure may be applied to flexible endoscopic systems for examination and microsurgery systems.

The technology according to the present disclosure is suitably applicable to the imaging unit 5009 among the configurations described above. Specifically, the imaging device 100 of FIG. 1 can be applied to the imaging unit 5009. By applying the technology according to the present disclosure to the imaging unit 5009, streaking can be curbed and a clearer surgical site image can be obtained. Hence, the surgery can be performed more safely and reliably.

6. Example of Application to Movable Body

The technology of the present disclosure (present technology) can be applied to various products. For example, the technology of the present disclosure may be implemented as a device mounted on any type of movable body such as a car, an electric car, a hybrid electric car, a motorcycle, a bicycle, a personal mobility, an airplane, a drone, a ship, a robot, or the like.

Figure 17:
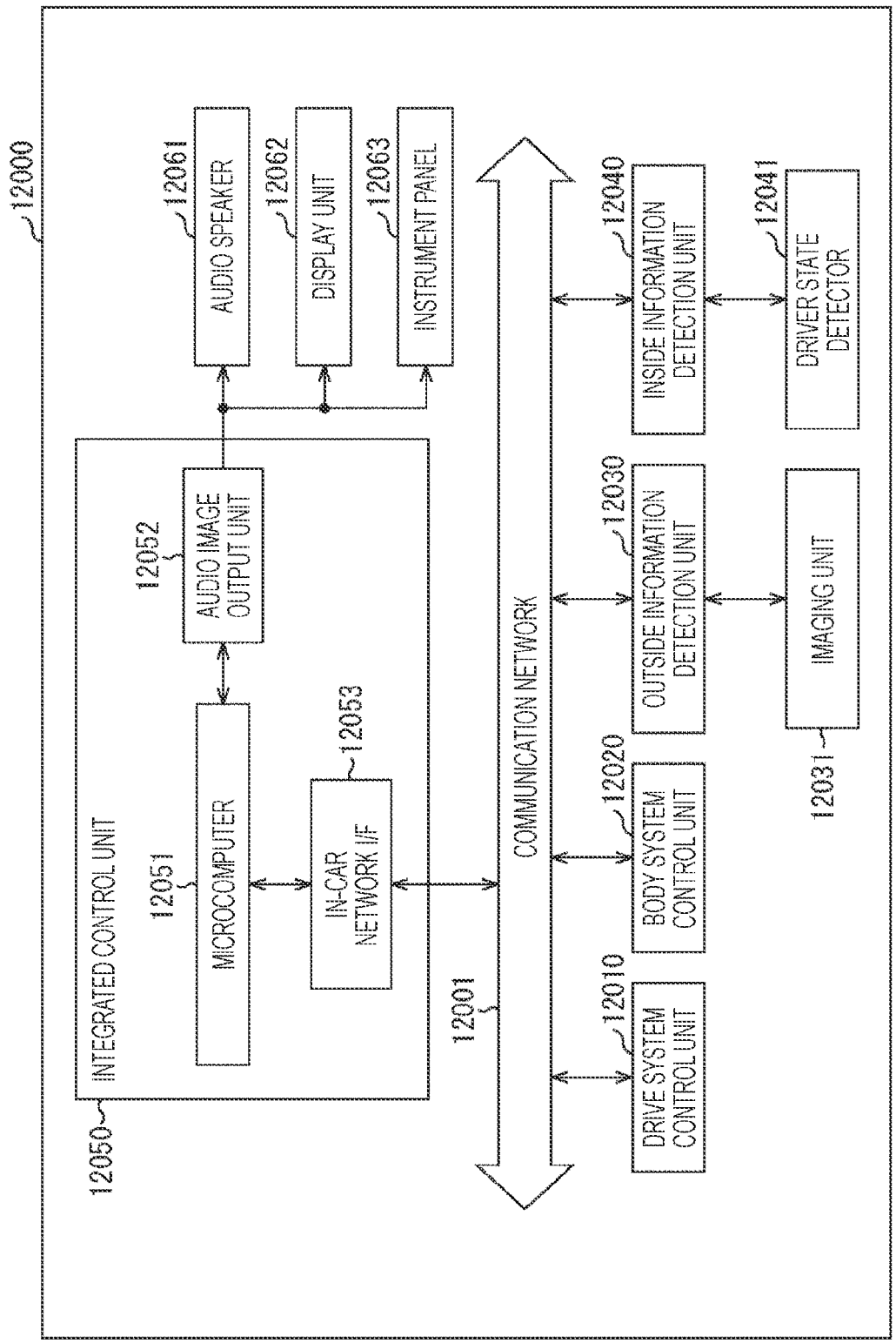
FIG. 17 is a block diagram showing a schematic configuration example of a vehicle control system.

FIG. 17 is a block diagram showing a schematic configuration example of a vehicle control system which is an example of a mobile control system to which the technology according to the present disclosure can be applied.

A vehicle control system 12000 includes multiple electronic control units connected through a communication network 12001. In the example shown in FIG. 17, the vehicle control system 12000 includes a drive system control unit 12010, a body system control unit 12020, an outside information detection unit 12030, an inside information detection unit 12040, and an integrated control unit 12050. Additionally, as a functional configuration of the integrated control unit 12050, a microcomputer 12051, an audio image output unit 12052, and an in-car network interface (I/F) 12053 are shown.

The drive system control unit 12010 controls the operation of devices related to the drive system of the vehicle according to various programs. For example, the drive system control unit 12010 functions as a control device of a drive force generation device for generating a drive force of a vehicle such as an internal combustion engine or a drive motor, a drive force transmission. mechanism for transmitting the drive force to wheels, a steering mechanism that adjusts the steering angle of the vehicle, a braking device that generates a braking force of the vehicle, and the like.

The body system control unit 12020 controls the operation of various devices equipped Cr the vehicle body according to various programs. For example, the body system control unit 12020 functions as a control device of a keyless entry system, a smart key system, a power window device, or various lamps such as a headlamp, a back lamp, a brake lamp, a blinker, or a fog lamp. In this case, the body system control unit 12020 may receive input of radio waves transmitted from a portable device substituting a key or signals of various switches. The body system control unit 12020 receives input of these radio waves or signals, and controls a door lock device, a power window device, a lamp, and the like of the vehicle.

The outside information detection unit 12030 detects information outside the vehicle equipped with the vehicle control system 12000. For example, an imaging unit 12031 is connected to the outside information detection unit 12030. The outside information detection unit 12030 causes the imaging unit 12031 to capture an image of the outside of the vehicle, and receives the captured image. The outside information detection unit 12030 may perform object detection processing or distance detection processing of a person, a vehicle, an obstacle, a sign, characters on a road surface, or the like on the basis of the received image.

The imaging unit 12031 is an optical sensor that receives light and outputs an electric signal corresponding to the amount of light received. The imaging unit 12031 can output an electric signal as an image or can output the electric signal as distance measurement information. Additionally, the light received by the imaging unit 12031 may be visible light or non-visible light such as infrared light.

The inside information detection unit 12040 detects information inside the vehicle. For example, a driver state detector 12041 that detects a state of a driver is connected to the inside information detection unit 12040. The driver state detector 12041 includes a camera for capturing an image of the driver, for example, and the inside information detection unit 12040 may calculate the degree of fatigue or concentration of the driver or determine whether or not the driver is asleep, on the basis of the detection information input from the driver state detector 12041.

The microcomputer 12051 can calculate a control target value of the drive force generation device, the steering mechanism, or the braking device on the basis of the information on the outside or the inside of the vehicle acquired by the outside information detection unit 12030 or the inside information detection unit 12040, and output a control command to the drive system control unit 12010. For example, the microcomputer 12051 can perform coordinated control aimed to achieve functions of an advanced driver assistance system (ADAS) including collision avoidance or shock mitigation of a vehicle, follow-up traveling based on an inter-vehicle distance, vehicle speed maintenance traveling, vehicle collision warning, vehicle lane departure warning, or the like.

Additionally, the microcomputer 12051 can control the drive force generation device, the steering mechanism, the braking device, or the like on the basis of the information around the vehicle acquired by the outside information detection unit 12030 or the inside information detection unit 12040, to perform coordinated control aimed for automatic driving of traveling autonomously without depending on the driver's operation, for example.

Additionally the microcomputer 12051 can output a control command to the body system control unit 12020 on the basis of the information outside the vehicle acquired by the outside information detection unit 12030. For example, the microcomputer 12051 control the headlamp according to the position of the vehicle ahead or oncoming vehicle detected by the outside information detection unit 12030, and perform coordinated control aimed for glare prevention such as switching from high beam to low beam.

The audio image output unit 12052 transmits an output signal of at least one of audio or an image to an output device capable of visually or aurally giving notification of information to a passenger or the outside of a vehicle. In the example of FIG. 17, an audio speaker 12061, a display unit 12062, and an instrument panel 12063 are shown as examples of the output device. The display unit 12062 may include at least one of an onboard display or a head-up display, for example.

Figure 18:
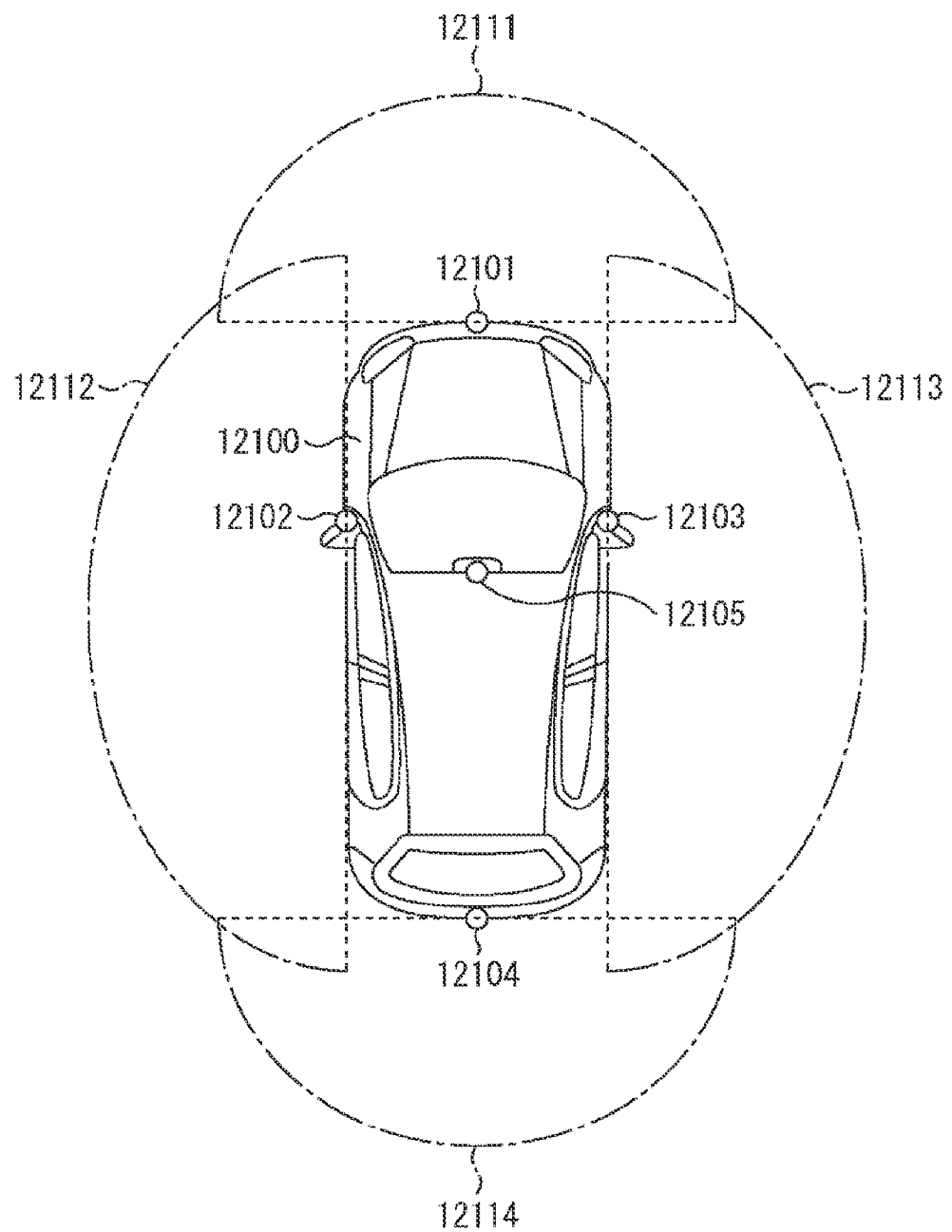
FIG. 18 is an explanatory diagram showing an example of an installation position of an imaging unit.

FIG. 18 is a diagram showing an example of the installation position of the imaging unit 12031.

In FIG. 18, imaging units 12101, 12102, 12103, 12104, and 12105 are included as the imaging unit 12031.

For example, the imaging units 12101, 12102, 12103, 12104, and 12105 are provided in positions such as a front nose, a side mirror, a rear bumper, a back door, and an upper portion of a windshield in the vehicle interior of the vehicle 12100. The imaging unit 12101 provided on the front nose and the imaging unit 12105 provided on the upper portion of the windshield in the vehicle interior mainly acquire images of the front of the vehicle 12100. The imaging units 12102 and 12103 provided on the side mirrors mainly acquire images of the sides of the vehicle 12100. The imaging unit 12104 provided on the rear bumper or the back door mainly acquires an image of the rear of the vehicle 12100. The imaging unit 12105 provided on the upper portion of the windshield in the vehicle interior is mainly used to detect a vehicle ahead or a pedestrian, an obstacle, a traffic light, a traffic sign, a lane, or the like.

Note that FIG. 18 shows an example of the imaging ranges of the imaging units 12101 to 12104. An imaging range 12111 indicates the imaging range of the imaging unit 12101 provided on the front nose, imaging ranges 12112 and 12113 indicate the imaging ranges of the imaging units 12102 and 12103 provided on the side mirrors, respectively, and an imaging range 12114 indicates the imaging range of the imaging unit 12104 provided on the rear bumper or the back door. For example, by superimposing the pieces of image data captured by the imaging units 12101 to 12104, a bird's eye view image of the vehicle 12100 as viewed from above can be obtained.

At least one of the imaging units 12101 to 12104 may have a function of acquiring distance information. For example, at least one of the imaging units 12101 to 12104 may be a stereo camera including multiple image sensors, or may be an image sensor haying pixels for phase difference detection.

For example, the microcomputer 12051 can measure the distance to each three-dimensional object in the imaging ranges 12111 to 12114 and the temporal change of this distance (relative velocity with respect to vehicle 12100) on the basis of the distance information obtained from the imaging units 12101 to 12104. As a result, the microcomputer 12051 can extract, in particular, as a vehicle ahead, the closest three-dimensional object on the traveling path of the vehicle 12100 that is traveling at a predetermined speed (e.g., 0 km/h or faster) in. substantially the same direction as the vehicle 12100. Moreover, the microcomputer 12051 can set in advance an inter-vehicle distance to be secured before the vehicle ahead, and perform automatic brake control (including follow-up stop control), automatic acceleration control (including follow-up start control), and the like. As described above, it is possible to perform coordinated control aimed for automatic driving of traveling autonomously without depending on the driver's operation, for example.

For example, on the basis of the distance information obtained from the imaging units 12101 to 12104, the microcomputer 12051 can extract three-dimensional object data regarding three-dimensional objects by classifying the data into a two-wheeled vehicle, an ordinary vehicle, a large vehicle, a pedestrian, and other three-dimensional objects such as a telephone pole, and use the data for automatic avoidance of obstacles. For example, the microcomputer 12051 identifies obstacles around the vehicle 12100 as obstacles visible or hardly visible to the driver of the vehicle 12100. Then, the microcomputer 12051 can determine the collision risk indicating the degree of risk of collision with each obstacle, and when the collision risk is a setting value or higher and there is a possibility of a collision, the microcomputer 12051 can perform driving support for collision avoidance by outputting a warning to the driver through the audio speaker 12061 or the display unit 12062, or by performing forcible deceleration or avoidance steering through the drive system control unit 12010.

At least one of the imaging units 12101 to 12104 may be an infrared camera that detects infrared light. For example, the microcomputer 12051 can recognize a pedestrian by determining whether or not a pedestrian is present in the images captured by the imaging units 12101 to 12104. Such pedestrian recognition is performed by a procedure of extracting feature points in images captured by the imaging units 12101 to 12104 as infrared cameras, and a procedure of performing pattern matching processing on a series of feature points indicating the outline of an object to determine whether or not the object is a pedestrian, for example. When the microcomputer 12051 determines that a pedestrian is present in the images captured by the imaging units 12101 to 12104 and recognizes the pedestrian, the audio image output unit 12052 controls the display unit 12062, so that a square outline for emphasis is superimposed on the recognized pedestrian. Additionally, the audio image output unit 12052 may control the display unit 12062, so that an icon or the like indicating a pedestrian is displayed in a desired position.

Hereinabove, an example of the vehicle control system to which the technology of the present disclosure can be applied has been described. Of the above-described configuration, the technology according to the present disclosure is applicable to the imaging unit 12031, for example. Specifically, the imaging device 100 of FIG. 1 can be applied to the imaging unit 12031. By applying the technology according to the present disclosure to the imaging unit 12031, streaking can be curbed and a captured image that is easier to see can be obtained, so that driver fatigue can be reduced.

Note that the above-described embodiments are an example for embodying the present technology, and the matters in the embodiments and the matters specifying the invention in the claims have a correspondence relationship. Similarly, the matters specifying the invention in the claims and the matters having the same names in the embodiments of the present technology have a correspondence relationship. Note, however, that the present technology is riot limited to the embodiments, and can be embodied by variously modifying the embodiments without departing from the gist of the present technology.

Note that the present technology can also be configured in the following manner.

(1) A solid-state image sensor including:
a voltage divider circuit that supplies a divided voltage of an input voltage and a predetermined reference voltage that are input;
an input-side differential transistor that outputs a drain current corresponding to a gate-source voltage between the divided voltage input to the gate and a predetermined source voltage;
an output-side differential transistor that outputs a voltage corresponding to the drain current as a result of comparison between the input voltage and the reference voltage; and
a control transistor that reduces the gate-source voltage in a case where the input voltage is out of a predetermined range.

(2) The solid-state image sensor according to (1) above further including:
a tail current source commonly connected to the source of the input-side differential transistor and the source of the output-side differential transistor;
an input-side current mirror transistor having the drain and gate connected to the drain of the input-side differential transistor; and
an output-side current mirror transistor having the drain connected to the drain of the output-side differential transistor, and the gate connected to the gate of the input side current mirror transistor, in which
the control transistor has the gate connected to the output node of the voltage divider circuit, and the source connected to a connection point of the input-side differential transistor and the input-side current mirror transistor.

(3) The solid-state image sensor according to (1) above further including:
a tail current source commonly connected to the source of the input-side differential transistor and the source of the output-side differential transistor;
an input-side resistor having one end connected to the drain of the input-side differential transistor; and
an output-side resistor having one end connected to the drain of the output-side differential transistor, in which
the control transistor has the gate connected to the output node of the voltage divider circuit, and the source connected to a connection point of the input-side differential transistor and the input-side resistor.

(4) The solid-state image sensor according to (3) above further including:
an input-side current mirror transistor having the gate connected to a connection point of the input-side differential transistor and the input-side resistor, and the drain connected to another end of the input-side resistor; and
an output-side current mirror transistor having the drain connected to another end of the output-side resistor, and the gate connected to the gate of the input-side current mirror transistor.

(5) The solid-state image sensor according to any one of (1) to (4) above, in which
the input-side differential transistor, the output-side differential transistor, and the control transistor are P-type transistors, and
the control transistor reduces a drain voltage of the input-side differential transistor in a case where the input voltage is lower than a predetermined value.

(6) The solid-state image sensor according to any one of (1) to (4) above, in which
the input-side differential transistor, the output-side differential transistor, and the control transistor are N-type transistors, and the control transistor increases a drain voltage of the input-side differential transistor in a case where the input voltage is higher than a predetermined value.

(7) The solid-state image sensor according to any one of (1) to (6) above, in which
the voltage divider circuit changes a voltage division ratio between the input voltage and the reference voltage according to a control signal.

(8) An imaging device including:
a voltage divider circuit that supplies a divided voltage of as input voltage and a predetermined reference voltage that are input;
an input-side differential transistor that outputs a drain current corresponding to a gate-source voltage between the divided voltage input to the gate and a predetermined source voltage;
an output-side differential transistor that outputs a voltage corresponding to the drain current as a result of comparison between the input voltage and the reference voltage;
a control transistor that reduces the gate-source voltage in a case where the input voltage is out of a predetermined range; and
a counter that counts a count value on the basis of the comparison result.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state image sensor
201 Light receiving chip
202 Circuit chip
211 Row selection unit
212 DAC
213 Pixel array unit
214 Timing controller
215 Horizontal transfer scanning unit
216 Signal processing unit
220 Pixel
221 Photoelectric conversion element
222 Transfer transistor
223 Reset transistor
224 Floating diffusion layer
225 Amplification transistor
226 Selection transistor
230 Constant current source unit
231 Constant current source
300 Analog to digital conversion unit
310 Counter
320 Latch
330 Comparator
331, 378 Tail current source
332, 333, 376, 377 Differential transistor
334, 335, 374, 375 Auto-zero switch
336, 371 Control transistor
337, 338, 372.373 Current mirror transistor
339, 341 to 345, 379 Capacitor
340 Voltage divider circuit
346 to 349 Switch
351, 352, 361, 362 Resistor
5009, 12031 Imaging unit

The invention claimed is:
1. A solid-state image sensor comprising:
a voltage divider circuit that supplies a divided voltage of an input voltage and a predetermined reference voltage that are input;
an input-side differential transistor that outputs a drain current corresponding to a gate-source voltage between the divided voltage input to the gate and a predetermined source voltage;
an output-side differential transistor that outputs a voltage corresponding to the drain current as a result of comparison between the input voltage and the reference voltage; and
a control transistor chat reduces the gate-source voltage in a case where the input voltage is out of a predetermined range.

2. The solid-state image sensor according to claim 1 further comprising:
a tail current source commonly connected to the source of the input-side differential transistor and the source of the output-side differential transistor;
an input-side current mirror transistor having the drain and gate connected to the drain of the input-side differential transistor; and
an output-side current mirror transistor having the drain connected to the drain of the output-side differential transistor, and the gate connected to the gate of the input-side current mirror transistor, wherein
the control transistor has the gate connected to the output node of the voltage divider circuit, and the source connected to a connection point of the input-side differential transistor and the input-side current mirror transistor.

3. The solid-state image sensor according to claim 1 further comprising:
a tail current source commonly connected to the source of the input-side differential transistor and the source of the output-side differential transistor;
an input-side resistor having one end connected to the drain of the input-side differential transistor; and
an output-side resistor having one end connected to the drain of the output-side differential transistor, wherein
the control transistor has the gate connected to the output node of the voltage divider circuit, and the source connected to a connection point of the input-side differential transistor and the input-side resistor.

4. The solid-state image sensor according to claim 3 further comprising:
an input-side current mirror transistor having the gate connected to a connection point of the input-side differential transistor and the input-side resistor, and the drain connected to another end of the input-side resistor; and
an output-side current mirror transistor having the drain connected to another end of the output-side resistor, and the gate connected to the gate of the input-side current mirror transistor.

5. The solid-state image sensor according to claim 1, wherein
the input-side differential transistor, the output-side differential transistor, and the control transistor are P-type transistors, and
the control transistor reduces a drain voltage of the input-side differential transistor in a case where the input voltage is lower than a predetermined value.

6. The solid-state image sensor according to claim 1, wherein
- the input-side differential transistor, the output-side differential transistor, and the control transistor are N-type transistors, and
- the control transistor increases a drain voltage of the input-side differential transistor in a case where the input voltage is higher than a predetermined value.

7. The solid-state image sensor according to claim 1, wherein
- the voltage divider circuit changes a voltage division ratio between the input voltage and the reference voltage according to a control signal.

8. An imaging device comprising:
- a voltage divider circuit that supplies a divided voltage of an input voltage and a predetermined reference voltage that are input;
- an input-side differential transistor that outputs a drain current corresponding to a gate-source voltage between the divided voltage input to the gate and a predetermined source voltage;
- an output-side differential transistor that outputs a voltage corresponding to the drain, current as a result of comparison between the input voltage and the reference voltage;
- a control transistor that reduces the gate-source voltage in a case where toe input voltage is out of a predetermined range; and
- a counter that counts a count value on a basis of the comparison result.

* * * * *